US011569757B2

(12) United States Patent
Spinella et al.

(10) Patent No.: US 11,569,757 B2
(45) Date of Patent: Jan. 31, 2023

(54) SYSTEM FOR TRANSFERRING ELECTRICAL POWER TO AN ELECTRICAL LOAD

(71) Applicant: EGGTRONIC ENGINEERING S.P.A., Modena (IT)

(72) Inventors: Igor Spinella, Modena (IT); Enrico Dente, Avigliana (IT); Giovanni Mascia, Rubiera (IT)

(73) Assignee: EGGTRONIC ENGINEERING S.P.A., Modena (IT)

( * ) Notice: Subject to any disclaimer, the term of this patent is extended or adjusted under 35 U.S.C. 154(b) by 0 days.

(21) Appl. No.: 17/279,445

(22) PCT Filed: Sep. 6, 2019

(86) PCT No.: PCT/IB2019/057523
§ 371 (c)(1),
(2) Date: Mar. 24, 2021

(87) PCT Pub. No.: WO2020/065426
PCT Pub. Date: Apr. 2, 2020

(65) Prior Publication Data
US 2022/0006396 A1 Jan. 6, 2022

(30) Foreign Application Priority Data
Sep. 26, 2018 (IT) .................. 102018000008935

(51) Int. Cl.
*H02J 50/12* (2016.01)
*H02M 7/537* (2006.01)

(52) U.S. Cl.
CPC ............ *H02M 7/537* (2013.01); *H02J 50/12* (2016.02)

(58) Field of Classification Search
CPC ........... H02J 50/12; H02J 50/00; H02M 7/357
See application file for complete search history.

(56) References Cited

U.S. PATENT DOCUMENTS

2015/0108945 A1 4/2015 Yan et al.
2015/0341085 A1* 11/2015 Ettes ................... H04B 5/0031
 307/104
2017/0214278 A1* 7/2017 Hosotani ................ H02J 50/12

FOREIGN PATENT DOCUMENTS

CA 2431689 A1 12/2004
EP 2670023 A1 12/2013
(Continued)

OTHER PUBLICATIONS

Sokal N 0et al: "Class E-A New Class Of 1-3 High-Effciency Tuned Single-Ended Switching Power Amplifiers", IEEE Journal of Solid-State Circuits, IEEE Service Center, Piscataway, NJ, USA, vol. 10, No. 3, Jun. 1, 1975.

(Continued)

*Primary Examiner* — Daniel Cavallari
*Assistant Examiner* — Joseph N Inge
(74) *Attorney, Agent, or Firm* — Browdy and Neimark, PLLC

(57) ABSTRACT

The invention describes a system (100) for transferring electrical power to an electrical load (110), comprising: a direct electrical voltage source (105), and at least one wave generator (145) adapted for converting the direct electric voltage into voltage waves to be transmitted to the electrical load (110); wherein said wave generator (145) comprises at least: an active switch (180) provided with two connection terminals (185, 190) and adapted for being controlled by an electric control signal between a saturation condition, in which it allows the passage of electrical current between said connection terminals (185, 190), and a prevention condition, in which it prevents said passage of electrical current, and a resonant circuit (200) sized to reduce the electrical power applied to said active switch (180) in the moments in which said active switch switches from the saturation condition to the prevention condition and vice-versa; and wherein said resonant circuit (200) comprises at least: a central electrical node (215) to which a first connection terminal (185) of the active switch (180) is connected, a first electrical branch (205) extending between said central electrical node (215) and a first terminal (210), a second electrical branch (220) extending between said cen- (Continued)

tral electrical node (215) and the first terminal (210) or between said central electrical node (215) and a further terminal (235) connected to a reference voltage, a resonance inductance (225) arranged on the first electrical branch (205), and a resonance capacity (230) arranged on the second electrical branch (220).

9 Claims, 22 Drawing Sheets

(56) References Cited

FOREIGN PATENT DOCUMENTS

| EP | 3113314 A1 | 1/2017 | |
|----|------------|--------|---|
| WO | 2013/014521 A1 | 1/2013 | |
| WO | WO-2013014521 A1 * | 1/2013 | ............ B60L 11/182 |
| WO | 2013150352 A1 | 10/2013 | |
| WO | 2015128397 A1 | 9/2015 | |
| WO | 2015198123 A1 | 12/2015 | |
| WO | 2017025833 A1 | 2/2017 | |

OTHER PUBLICATIONS

Aleksander Skala: "Determination of Efficiency in a Single-Switch Class EZVS-IS Quasi-Resonant Inverter in Application for Induction Heating", Przeglad Elektrotechniczny, vol. 1, No. 3, Mar. 5, 2016.

* cited by examiner

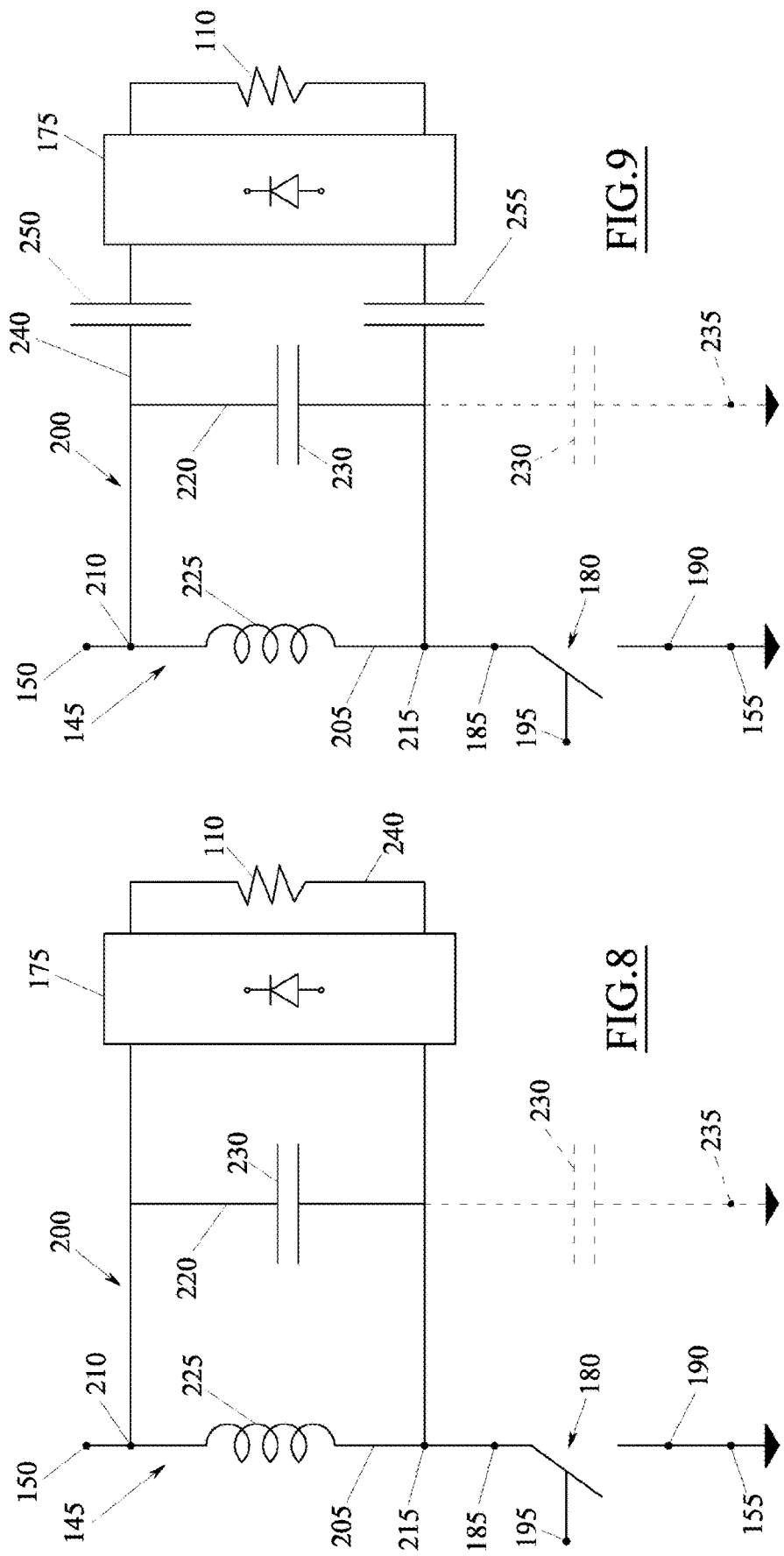

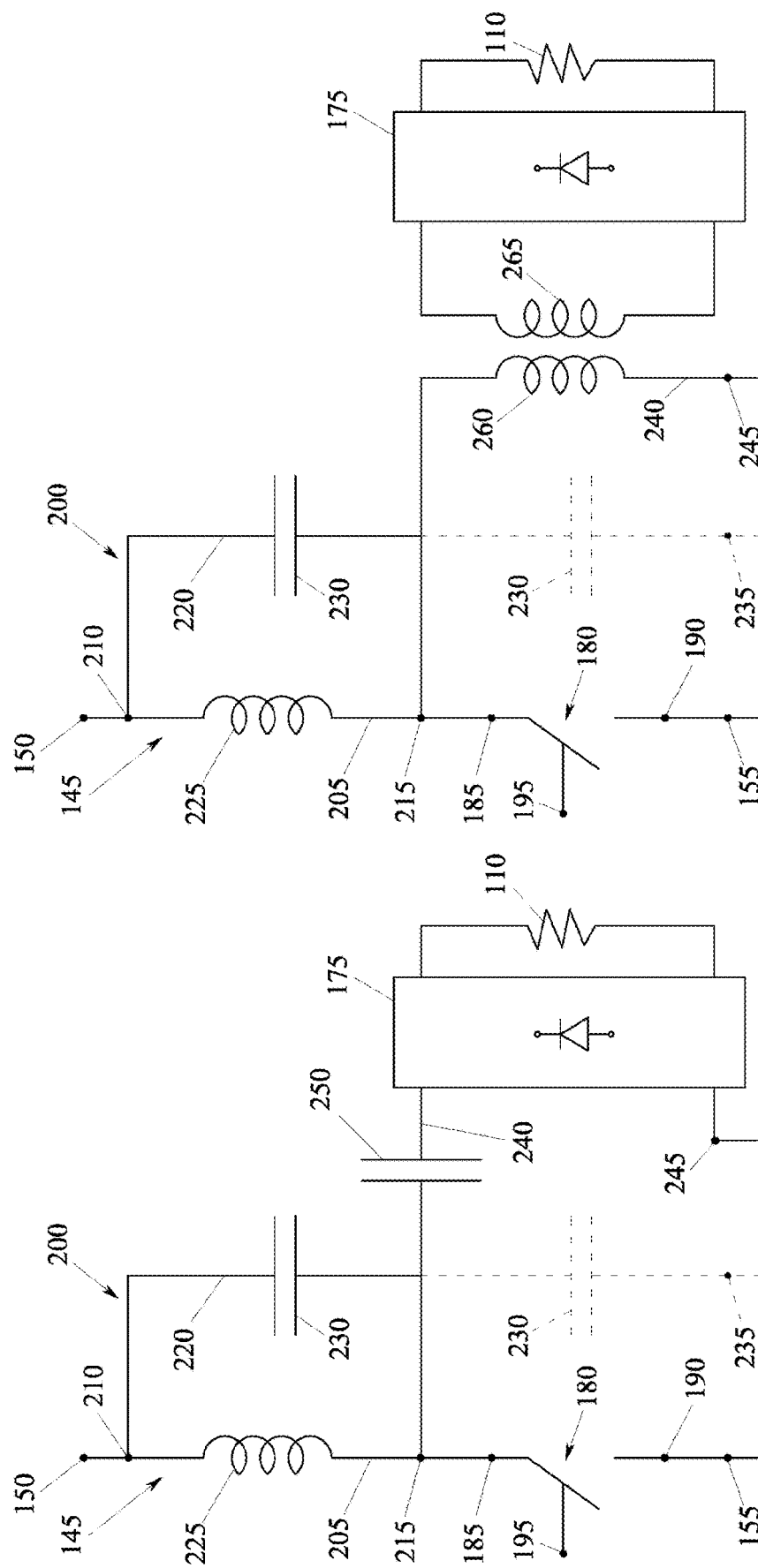

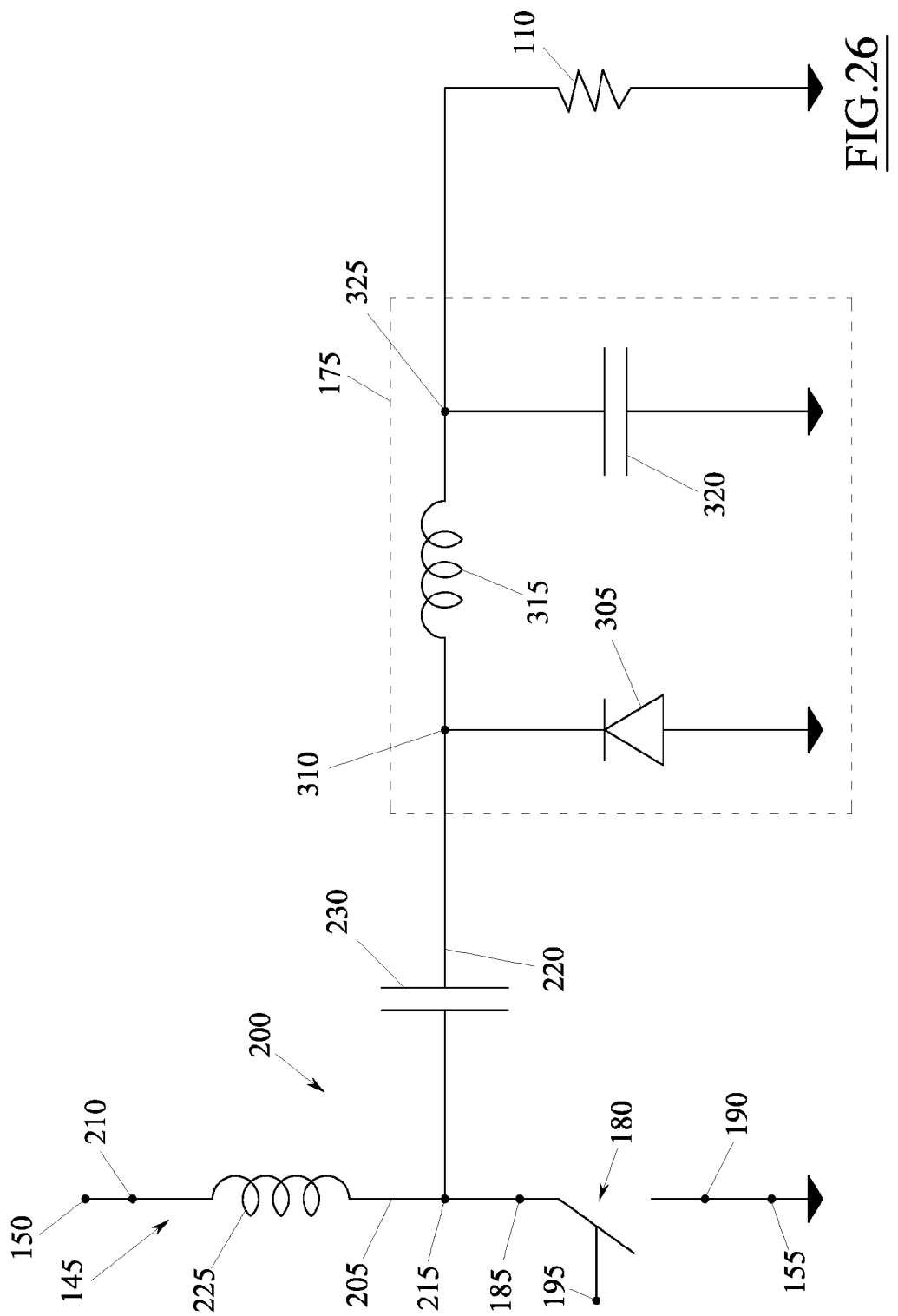

FIG.33

SYSTEM FOR TRANSFERRING ELECTRICAL POWER TO AN ELECTRICAL LOAD

TECHNICAL FIELD

The present invention concerns a system for transferring electrical power to an electrical load. The electrical load can for example be any electrical or electronic device that must be fed electrically to allow the operation thereof and/or to charge the inner batteries of the device itself. Classic examples of this type of electrical/electronic devices include, but are not limited to, smartphones, computers, laptops, tablets, television sets, domestic appliances, automated systems, servers and many other similar devices.

PRIOR ART

A solution currently very widely used for transferring electrical power to an electrical load is that of using a converter, i.e. an electric circuit configured so as to transform an input voltage into a voltage suitable for feeding the load.

For example, there are known AC/DC converters adapted for transforming an alternating voltage into a direct voltage, DC/AC converters adapted for transforming a direct voltage into an alternating voltage and also DC/DC or AC/AC converters adapted for transforming a direct/alternating voltage into another direct/alternating voltage but having different characteristics.

In order to ensure greater safety of use and strength, all of these converters can be made according to an insulated configuration, i.e. they can comprise a primary electric circuit connected to the input voltage and a secondary electric circuit connected to the electrical load, which are galvanically insulated from one another.

A very common strategy for galvanically insulating the primary circuit from the secondary circuit of a converter is to use an inductive coupling.

A typical implementation of this strategy consists of the AC/DC converter of the flyback type, in which the galvanic insulation is obtained through a transformer that allows an electromagnetic coupling between the primary circuit and the secondary circuit.

Another example of this strategy is provided by wireless transmission systems of electrical power that use inductive coils, including at least one transmission coil arranged in the primary circuit and at least one receiving reel arranged in the secondary circuit.

When the two inductive coils are brought towards one another, they make an electromagnetic coupling that ensures the transfer of electrical power between the two circuits.

Another strategy for galvanically insulating the primary circuit from the secondary circuit of a converter is to separate them through a pair of insulation capacities, which make a capacitive coupling capable of transmitting the electrical power.

The advantages of converters insulated in a capacitive manner are many, but they mainly consists of the possibility of greatly reducing the space occupied, thanks to the elimination of the transformer and to the possibility of increasing the operating frequencies (for example reaching hundreds of kHz, MHz, tens of MHz or hundreds of MHz).

A further advantage of these converters insulated in a capacitive manner is the fact that it is possible to reach a higher operating efficiency, which typically remains stable both for light electrical loads and for heavy electrical loads, rather than a tendentially low efficiency with peaks only for certain load ranges, as typically occurs in converters insulated through transformer.

Irrespective of these considerations, in both categories of insulated converters, both those based on inductive coupling and those based on capacitive coupling, the primary circuit is generally in the form of a wave generator, i.e. a switching electric circuit capable of exciting the transmission elements of the power, i.e. the inductances or the capacities, with a high-frequency voltage wave.

In particular, for all the types of converters outlined above, it is generally advantageous to increase the frequency of the voltage wave as much as possible, so as to make all of the components more compact and transmit more power to the electrical load.

For this reason, especially in converters with capacitive coupling, but also in converters with inductive coupling, it is useful to use wave generators based on resonant circuit schemes, for example based on class D resonant circuits, E, F, E/F, $E^{-1}$, $F^{-1}$ or similar.

This type of circuit, indeed, makes it possible to drastically reduce the dynamic losses in the active components (switches, for example MOSFET), as well as the electromagnetic emissions (EMI), and to substantially increase the maximum operating frequency of the circuit, to the benefit of the space occupied, the weight and the costs.

An example of a resonant circuit, which is used as wave generator in a converter insulated through capacitive coupling, is illustrated in international patent application WO2013150352.

One of the few drawbacks of this architecture is, however, represented by the need to place a choke inductance of great value between the feed voltage of the circuit and the active switch.

This choke inductance should indeed have a theoretically infinite value, in order to behave substantially as a current generator, which charges, during the rime period in which the active switch is turned on, and discharges feeding the circuit with a roughly constant current, during the time period on which the active switch is turned off. Clearly, in real circuits the choke inductance does not have an infinite value but in any case a very large one.

The presence of this large choke inductance, through which the currents useful for feeding the load flow, substantially increases the space occupied by the circuit and, due to the parasitic phenomena typical of real inductances, like for example magnetic hysteresis, the eddy currents in the magnetic materials, the skin effect and the Joule effect, substantially reduces the efficiency thereof.

SUMMARY OF THE INVENTION

In light of what has been outlined above, a purpose of the present invention is to provide a solution that makes it possible to solve, or at least substantially reduce, the aforementioned drawbacks of the prior art.

Another purpose is to achieve such an objective with a simple, rational and as low cost as possible solution.

These and other purposes are accomplished by the characteristics of the invention given in independent claim 1. The dependent claims outline preferred and/or particularly advantageous aspects of the invention.

In particular, an embodiment of the present invention provides a system for transferring electrical power to an electrical load, comprising:
- a direct electrical voltage source, and
- at least one wave generator adapted for converting the direct electric voltage into voltage waves to be transmitted to the electrical load, wherein said wave generator comprises at least:
- an active switch provided with two connection terminals and adapted for being controlled by an electric control signal between a saturation condition, in which it allows the passage of electrical current between said connection terminals, and a prevention condition, in which it prevents said passage of electrical current, and
- a resonant circuit sized to reduce (preferably zero) the electrical power applied to said active switch in the moments in which said active switch switches from the saturation condition to the prevention condition and vice-versa, wherein said resonant circuit comprises at least:
- a central electrical node to which a first connection terminal of the active switch is connected,
- a first electrical branch extending between said central electrical node and a first terminal,
- a second electrical branch extending between said central electrical node and the first terminal or between said central electrical node and a further terminal connected to a reference voltage,
- a resonance inductance arranged on the first electrical branch, and
- a resonance capacity arranged on the second electrical branch.

Thanks to this solution, at the central electrical node of the resonant circuit, it is advantageously possible to obtain a waveform of the electric voltage equal, or in any case totally analogous, to that which can be obtained through a wave generator based on a resonant circuit structure, therefore Zero Voltage or Zero Current Switching (ZVS or ZCS) for example in class E or similar.

Consequently, the wave generator proposed above has the advantage of reducing the electrical losses during the switching steps of the switch and of thus being able to increase the operating frequencies.

With respect to conventional wave generators, the wave generator proposed above also has the substantial advantage of not requiring bulky choke inductances, achieving a significant reduction of the size and costs of the system, as well as increasing the efficiency thereof.

From the base scheme outlined above, the wave generator can be connected to the load in various different ways.

According to an embodiment of the invention, the electrical load can be connected to the first or to the second electrical branch of the resonant circuit, so that said first or second electrical branch is adapted for absorbing active electrical energy by virtue of the electrical load connected to it.

In this way, it is indeed possible to reduce the number and size of the components that constitute the entire system, which can be more compact and cost-effective.

For example, one aspect of this embodiment provides that the electrical load can be arranged on the first electrical branch of the resonant circuit in series with the resonance inductance.

Thanks to this solution, it is possible to obtain a structurally very simple system.

According to a variant of this solution, the electrical load could be arranged in a secondary circuit, which is galvanically insulated from the first electrical branch to which it is magnetically connected through inductive coupling.

In this way, an insulated system is obtained that makes it possible to increase safety of use and strength.

The inductive coupling can for example comprise the resonance inductance and a coupling inductance arranged in the secondary circuit and adapted for inductively coupling with the resonance inductance.

Thanks to this solution, the resonance inductance can perform the dual function of a resonator and of transmitting element of the electrical power, saving components and thus simplifying the system.

More specifically, the inductive coupling can comprise a transformer provided with a magnetic core on which a primary winding is wound, which at least partially constitutes the resonance inductance, and a secondary winding is wound, which at least partially constitutes the coupling inductance.

In this way it is possible to ensure a particularly safe and efficient inductive coupling. Alternatively, the inductive coupling could comprise a wireless transmission coil, which at least partially constitutes the resonance inductance, and a wireless receiving coil, which at least partially constitutes the coupling inductance.

In this way, a wireless transmission system of the electrical power in an inductive manner is made that makes it possible, for example, to install the electrical load and the wireless receiving coil in a device (e.g. smartphone, portable computer or other) that is separate and mobile with respect to the device (e.g. recharging base) in which the wireless receiving coil and the wave generator connected to the direct voltage source is installed.

A variant of the embodiment under examination provides that the electrical load can be arranged on the second electrical branch of the resonant circuit in series with the resonance capacity.

This solution indeed also makes it possible to obtain a structurally very simple system.

For example, the electrical load could be arranged in a secondary circuit, which is galvanically insulated from the second electrical branch to which it is electrically connected through capacitive coupling.

In this way, an insulated system is obtained that makes it possible to increase safety of use and strength.

With respect to the aforementioned inductive coupling, this capacitive coupling also has the advantage of reducing the space occupied, of increasing efficiency and of allowing higher operating frequencies.

The capacitive coupling can comprise for example at least one pair of insulation capacities, each of which at least partially constitutes the resonance capacity.

In this way it is indeed advantageously possible to obtain a completely insulated system.

The insulation capacities can consist of discreet capacities, i.e. inseparable capacitive components.

Alternatively, each of said insulation capacities could comprise a wireless transmission plate and a wireless receiving plate adapted for facing said wireless transmission plate.

In this way, a wireless transmission system of the electrical power in a capacitive manner is made that makes it possible, for example, to install the electrical load and the wireless receiving plate in a device (e.g. smartphone, portable computer or other) that is separate and mobile with respect to the device (e.g. recharging base) in which the wireless transmission plate and the wave generator connected to the direct voltage source are installed.

An alternative embodiment of the present invention provides that the system can comprise an electrical connection branch extending between the central electrical node and the first terminal or between the central electrical node and a further terminal connected to a reference voltage, and that the electrical load can be connected to said electrical connection branch, so that the electrical connection branch is adapted for absorbing active electrical energy by virtue of the electrical load connected to it.

In this way, it is indeed also possible to effectively transmit the voltage wave generated by the wave generator to the electrical load, always using a reduced number of components.

For example, the electrical load can be arranged directly on said electrical connection branch.

Thanks to this solution it is possible to obtain a structurally very simple system. According to a variant of this solution, the electrical load could be arranged in a secondary circuit, which is galvanically insulated from the electrical connection branch to which it is electrically connected through capacitive or inductive coupling.

In this way, an insulated system is indeed obtained that makes it possible to increase safety of use and strength.

Also in this case, the inductive or capacitive coupling can be made through inseparable components (e.g. transformer or discreet capacity) or through separable components (e.g. wireless coils or plates), according to the same ways outlined earlier.

A different aspect of the invention provides that the system can comprise at least two or more of the wave generators outlined above, which are configured to transmit mutually dephased voltage waves, preferably in counterphase to the electrical load.

In this way, a multi-phase system is obtained that makes it possible to achieve multiple advantages, including that of increasing the power transmitted to the electrical load for the same feed voltage, of reducing the voltage ripple on the electrical load and/or of improving the power factor of the system.

Another aspect of the invention, applicable to all of the embodiments outlined earlier and their variants, provides that the system can comprise a rectifier adapted for receiving the voltage wave generated by the wave generator, for converting said voltage waves into a rectified voltage and for applying said rectified voltage to the electrical load.

Thanks to this solution the electrical load can be fed with a direct voltage or comparable to a direct voltage.

According to another aspect of the invention, the direct voltage source can in turn comprise a rectifier adapted for receiving an alternating voltage in input and for converting said alternating voltage that feeds the wave generator.

In this way, the system in practice becomes an AC/DC or AC/AC converter that can be advantageously connected to a common electrical distribution network.

However, this does not rule out the possibility that, in other embodiments, the direct voltage source can comprise a direct voltage generator or a battery.

A further aspect of the invention provides that the resonant circuit of the wave generator can comprise a tank capacity connected in parallel to the active switch.

The presence of this tank capacity makes it possible to reduce the electrical losses that can occur in the active switch during the transients from the saturation condition (turned on) to the prevention condition (turned off).

Indeed, at the moment at which the active switch is turned off, the tank capacity is discharged and constitutes a low impedance path capable of reducing the current in the active switch and thus the losses.

If the tank capacity is not sufficient, the resonant circuit could comprise a further inductance arranged in series between the central electrical node and the active switch.

In this way, the resonant circuit will substantially comprise a first resonator LC made by the resonance inductance and by the resonance capacity and a second resonator LC made by the tank capacity and by said further inductance.

These two resonators LC can be tuned so as to ensure over the switch substantially the same waveform of a ZVS circuit in turning on phase (therefore zero voltage and loss losses when turning on) and to substantially reduce or zero the current on the active switch in turning off phase, so as to ensure or approach, in turning off step, a particularly advantageous ZCS condition because it has low loss.

BRIEF DESCRIPTION OF THE FIGURES

Further characteristics and advantages of the invention will become clear from reading the following description provided as a non-limiting example, with the help of the figures illustrated in the attached tables.

FIGS. 8 to 10 show as many variants to the scheme of FIG. 7.

FIGS. 12 to 15 show as many variants to the scheme of FIG. 11.

FIGS. 23 to 29 show as many variants to the scheme of FIG. 22.

FIGS. 32 to 36 show as many variants of the embodiment of FIG. 31.

DETAILED DESCRIPTION

Figure 1:
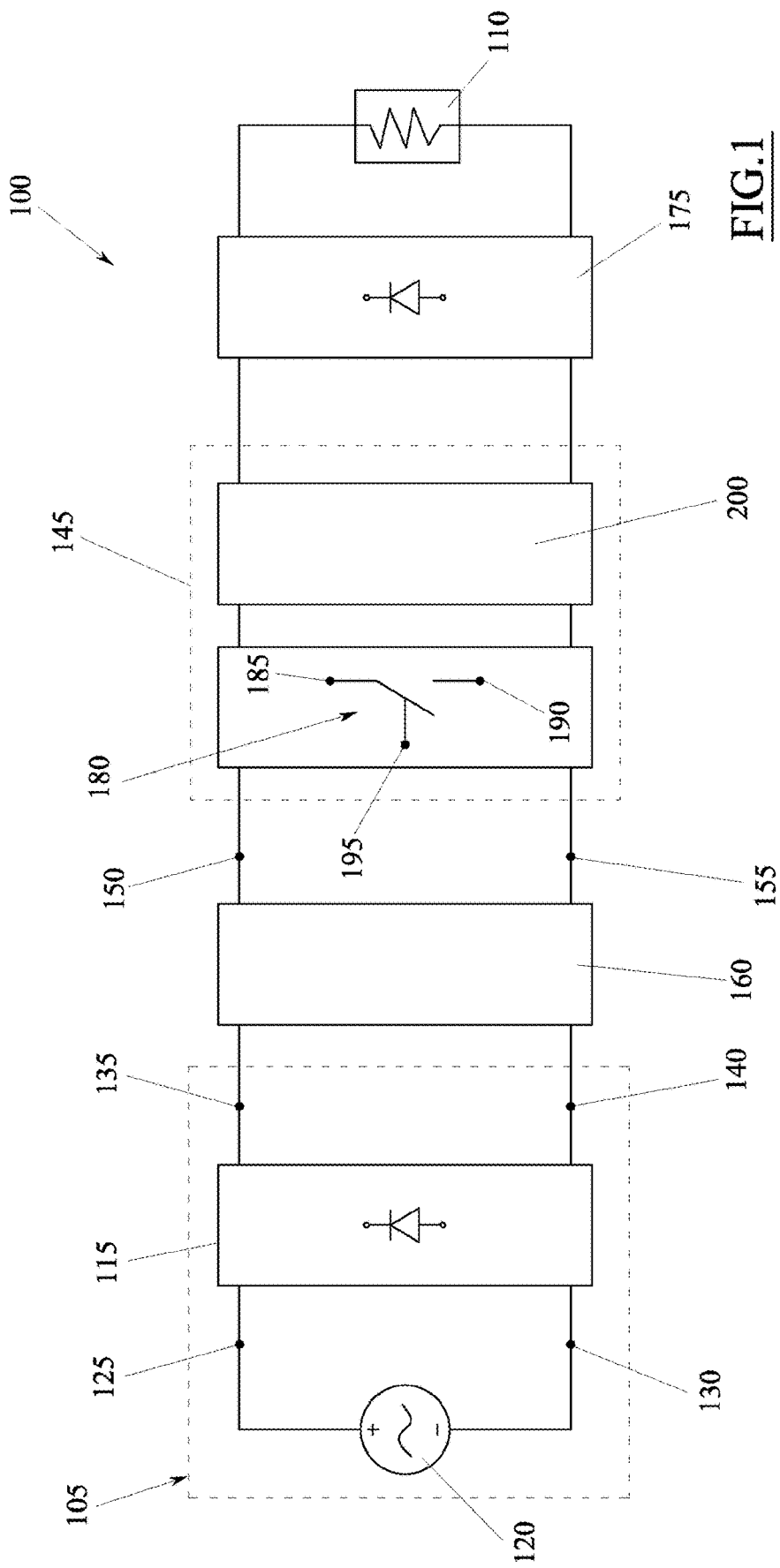
FIG. 1 is the general scheme of a system for transferring electrical power according to an embodiment of the present invention.

An embodiment of the present invention provides a system 100 for transferring electrical power from a direct electrical voltage source 105, or at least comparable to a direct voltage, to an electrical load 110.

The electrical load 110, which is generically represented with the symbol of an electrical resistance, can be any electric or electronic device that must be fed electrically to allow the operation thereof and/or to charge the internal batteries of the device itself.

Classic examples of electric/electronic devices of this type are computers, tablets, smartphones, television sets, domestic appliances, automated systems, servers and many others.

In some embodiments, the direct voltage source 105 can be a generator of direct voltage or a battery.

In other embodiments, the direct voltage source 105 can on the other hand comprise a rectifier 115 adapted for receiving in input an alternating voltage coming from an alternating voltage source 120, for converting said alternating voltage into a rectified voltage more or less comparable to a direct voltage and for supplying said direct voltage in output.

The alternating voltage source 120 can be for example a common electrical distribution network, which can be adapted for supplying an alternating voltage of variable value depending on the country or use (e.g. industrial or domestic). Purely as an example, the alternating voltage source 120 can be a 50-60 Hz, 90-260V AC network.

In general terms, the rectifier 115 can comprise a first input terminal 125 and a second input terminal 130, which can be connected to the alternating voltage source 120, so that the latter is adapted for applying a difference in electrical voltage that is variable in an alternating manner over time (alternating voltage) between these two terminals.

For example, the second input terminal 130 of the rectifier 115 can be connected to a reference voltage, and is generally defined as neutral terminal, and the alternating voltage source 120 can be adapted for applying to the first input terminal 125, in general called phase terminal, a voltage that varies in a sinusoidal manner over time around the average value defined by the reference voltage. It should be noted how the generator 120 can be connected to the terminals 125 and 130 exchanging the terminals without this influencing the output of the rectifier 115.

The rectifier 115 can further comprise a first output terminal 135 and a second output terminal 140, between which the difference in direct electric voltage obtained by the conversion of the alternating voltage received in input is applied, where the value of the electrical voltage applied to the first output terminal 135 is generally not less than the electrical voltage applied to the second output terminal 140.

For example, the second output terminal 140 can be connected to the reference voltage whereas the first output terminal 135 can have a constant voltage (minus the ripple) applied to it, of value not less than the value of the reference voltage, which is obtained by the rectification of the input alternating voltage.

The rectifier 115 can be made in the form of a diode bridge (for example Graetz bridge) but this does not rule out the possibility that, in other embodiments, it can be a rectifier with a single diode, with a combined double diode, a synchronous rectifier or other.

Possibly, the rectifier 115 can be provided with a filtering circuit, for example a capacitive filter, the function of which is that of stabilizing the voltage difference between the first and the second output terminal 135 and 140, reducing the ripple and thus levelling the voltage at a substantially constant value over time.

The system 100 also comprises at least one wave generator, globally indicated with 145, i.e. an electric circuit that is fed by the direct voltage source 105, for example by the rectifier 115, to generate a voltage wave, i.e. a succession of voltage pulses that follow one another with a predetermined time frequency.

Preferably, the wave generator 145 is adapted for generating a high-frequency voltage wave, typically of the order of hundreds of KHz, MHz, tens of MHz or hundreds of MHz.

In general terms, the wave generator 145 can comprise a first input terminal 150 and a second input terminal 155, between which a substantially constant voltage difference is applied, obtained from the voltage supplied by the direct voltage source 105, where the value of the electrical voltage applied to the first input terminal 150 is generally greater than the electrical voltage value applied to the second input terminal 155

For example, the second input terminal 155 can be connected to the reference voltage whereas the first input terminal 150 can be connected to the first output terminal 135 of the rectifier 115.

Possibly, between the rectifier 115 and the wave generator 145 it is possible to arrange an intermediate converter 160, which is adapted for receiving in input the voltage supplied by the rectifier 115 and for converting it into another voltage, for example into a voltage of reduced value, more suitable for feeding the wave generator 145 and/or useful for other purposes, for example to improve the power factor and/or to facilitate the control of the system 100.

The voltage wave produced in output from the wave generator 145 is then transferred to the electrical load 110.

Possibly, between the wave generator 145 and the electrical load 110 it is possible to arrange a rectifier 175, which is adapted for rectifying the voltage wave coming from the wave generator 145, so as to convert it and obtain a rectified voltage in output, for example comparable to a direct voltage, useful for feeding the electrical load 110. The rectifier 175 can be a rectifier based on a diode bridge (for example Graetz bridge), a rectifier with a single diode, with a combined double diode, a synchronous rectifier or other.

Also in this case, the rectifier 175 can be provided with a filtering stage capable of stabilizing the voltage in output, levelling it at a substantially constant value or in any case comparable to constant over time (minus possible residual ripples, which may even be significant).

It should be observed that, in some embodiments, the rectifier 175 could be absent, thus obtaining a system 100 capable of feeding the electrical load 110 with an alternating voltage.

In order to generate the voltage wave, the wave generator 145 comprises at least one active switch 180, for example a transistor (e.g. bipolar junction transistor BJT, field effect transistor FET, MOSFET, GaN, SiC, MESFET, JFET, IGBT and others), which is adapted for turning on and off (i.e. passing from a prevention condition to a saturation condition and vice-versa) upon command of a suitable electric control signal.

More in particular, the active switch 180 can comprise a first connection terminal 185 (e.g. the drain of a MOSFET of type N), a second connection terminal 190 (e.g. the source of a MOSFET of type N), and a control terminal 195 (e.g. the gate of a MOSFET of type N).

When the active switch 180 is turned off, i.e. it is in prevention condition, the electrical current cannot slide between the first and the second connection terminal 185 and 190.

Vice-versa, when the active switch 180 is turned on, i.e. it is in saturation condition, the electrical current slides freely between the first and the second connection terminal 185 and 190.

The switching of the active switch 180 between these two conditions is controlled by the electric control signal, which is applied to the control terminal 195.

In practice, when the voltage of the electric control signal is greater than or equal to a certain threshold value, the active switch 180 is in saturation condition (turned on and capable of carrying electrical current).

When, vice-versa, the voltage of the electric control signal is less than the threshold value, the active switch 180 is in prevention condition (turned off).

In order to generate the voltage wave, the electric control signal can be a periodic signal that varies with a predetermined frequency between a minimum voltage value (possibly zero) below the threshold value of the active switch 180 and a maximum value above said threshold value.

For example, the electric control signal can be a square wave signal having constant frequency and, generally but not necessarily, duty cycle equal to 50%.

The frequency of the electric control signal, which in practice corresponds to the switching frequency of the active switch 180 and, therefore, to the frequency of the voltage wave generated, is preferably selected of very high value, for example of the order of hundreds of KHz, of MHz, of tens of MHz or of hundreds of MHz.

The electric control signal can be generated by a suitable driver (not illustrated), which can be suitably connected to the control terminal 195 of the active switch 180 through any system capable of transferring electric signals (also wireless).

As well as the active switch 180, the wave generator 145 also comprises a resonant circuit 200, for example a completely resonant or quasi-resonant reactive circuit.

The resonant circuit 200 is in general an electric circuit that comprises one or more reactances, for example one or more capacities and/or inductances, which are suitably connected to one another and tuned so as to resonate at a given frequency.

The tuning of the resonant circuit 200 essentially consists of sizing the aforementioned reactances, in terms of capacity and electrical inductance, respectively.

In this case, the resonant circuit 200 is connected to the active switch 180 and is tuned so as to reduce the electrical power (e.g. voltage and/or current) that is applied to the active switch 180, during every switching phase from off to on and vice-versa.

Preferably, the resonant circuit 200 is tuned so that, during every switching phase of the active switch 180, the electrical power (e.g. the voltage and/or the current) applied to the active switch 180 is reduced to a value equal to zero or substantially equal to zero, in this way obtaining a wave generator 145 operating in zero voltage switching (ZVS) or zero current switching (ZCS) mode.

For example, the resonant circuit 200 can be tuned so as to resonate at a frequency equal or close to the control frequency of the active switch 180.

In this way, the electrical losses are substantially reduced during the switching cycles of the active switch 180, making it possible to increase the frequency of such cycles and thus the frequency of the voltage wave generated by them, with the result of being able to increase the electrical power transmitted for the same voltage applied, or being able to lower the voltage applied for the same electrical power transmitted.

Figure 2:
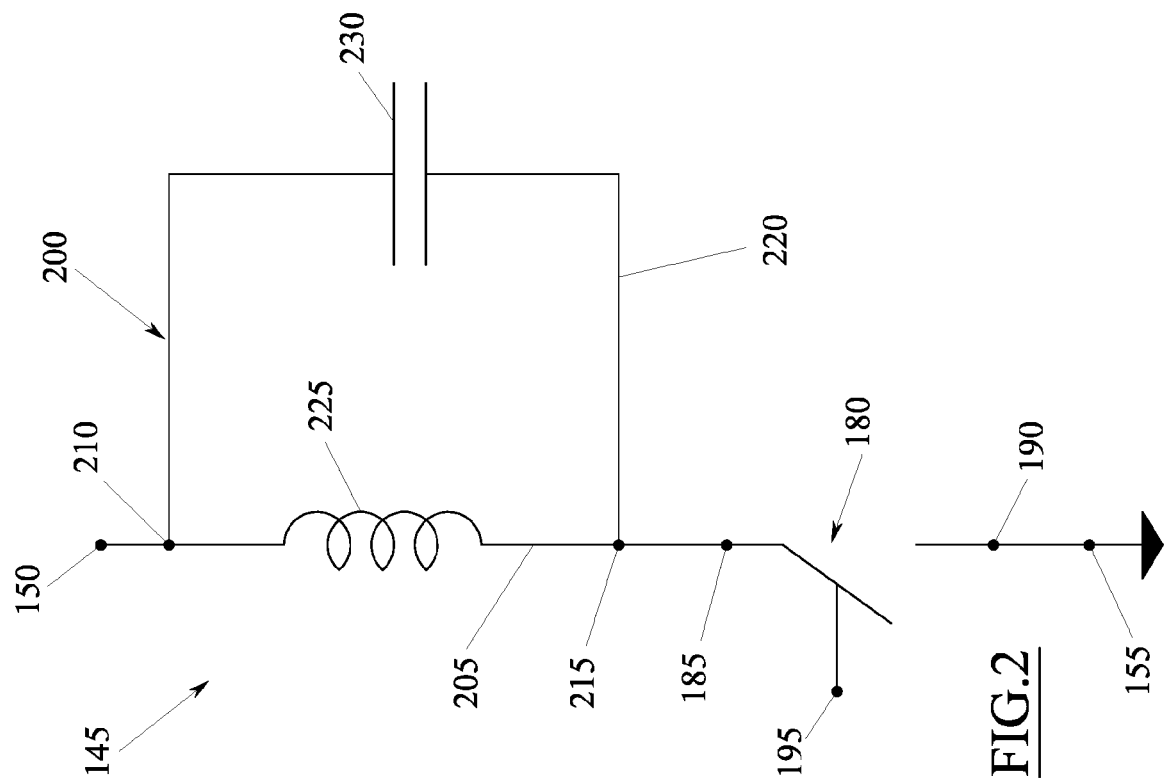
FIG. 2 is the electrical scheme of a wave generator able to be used in the system of FIG. 1.

From these general considerations, a possible embodiment of the wave generator 145 and of the relative resonant circuit 200 is illustrated in FIG. 2.

In this embodiment, the resonant circuit 200 comprises a central electrical node 215, to which the first connection terminal 185 of the active switch 180 (for example the drain of a MOSFET of type N) can be connected.

The second connection terminal 190 of the active switch 180 (for example the source of a MOSFET of type N) can be connected to the reference voltage.

The resonant circuit 200 also comprises a first electrical branch 205, which extends from the central electrical node 215 to a first terminal 210 that can be connected (i.e. coincide) with the first input terminal 150 of the wave generator 145.

The resonant circuit 200 also comprises a second electrical branch 220 that can also extend between the first terminal 210 and the central electrical node 215, so as to be connected in parallel with the first electrical branch 205.

On the first electrical branch 205 it is possible to arrange a resonance inductance 225 whereas on the second electrical branch 220 it is possible to arrange a resonance capacity 230.

As stated earlier, the resonance inductance 225 and the resonance capacity 230 are sized (tuned) so as to make a resonator that reduces, preferably zeroes, the electrical power (for example the voltage and/or the current) that is applied to the active switch 180 during every single switching phase.

Figure 6:
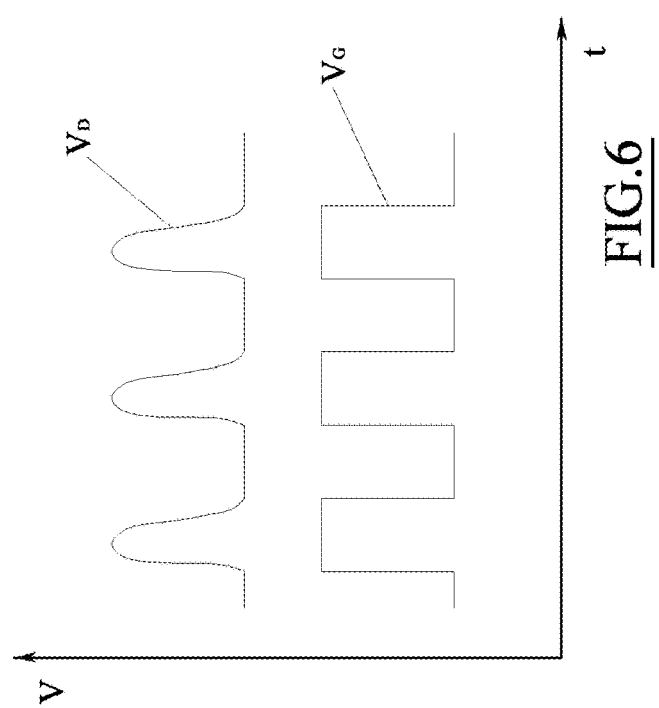
FIG. 6 is a graph that shows a possible shape of the voltage wave able to be obtained at the central electrical node of the wave generators according to FIGS. 2 and 3 as a function of the control signal.

In this way, at the central electrical node 215, it is advantageously possible to obtain an electric voltage VD that, as a function of the electric control signal VG of the active switch 180, is variable over time according to the waveform represented in FIG. 6 or according to similar waveforms and in particular capable of ensuring transitions ZVS and/or ZCS of the switch 180.

In practice, it is a waveform the same as or in any case analogous to those that can be obtained through a wave generator based on a circuit structure similar to an amplifier in class E or based on any other resonant amplifier ZVS and/or ZCS.

Obtaining the same waveform, i.e. generating the same voltage wave, the wave generator 145 outlined above obtains the same advantages as the resonant wave generators mentioned earlier, in particular in terms of reduction of the electrical losses during the switching phases of the active switch and thus of increasing the operating frequencies.

With respect to these wave generators, the wave generator 145 however has the substantial advantage of not needing bulky choke inductances, allowing a significant reduction of size and costs.

Figure 3:
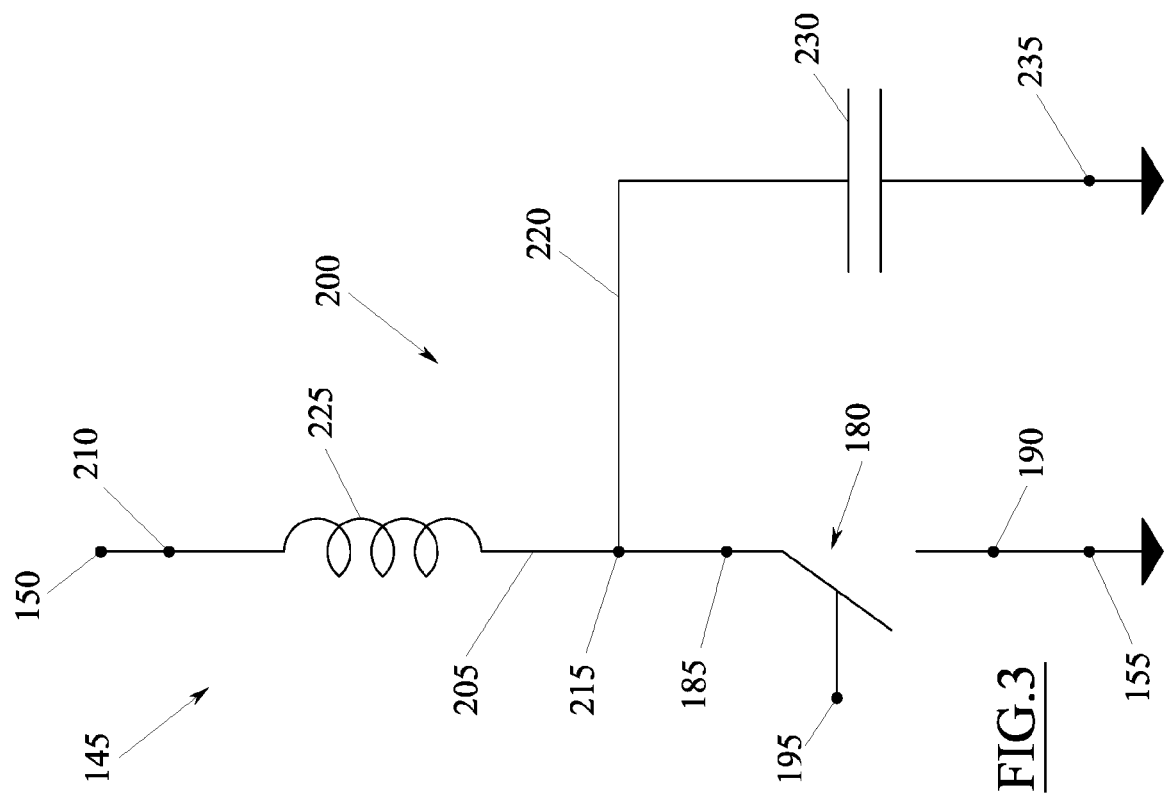
FIG. 3 is the electrical scheme of another wave generator able to be used in the system of FIG. 1.

The same waveform, and therefore the same advantages as the wave generator 145 represented in FIG. 2, can also be obtained by the wave generator 145 illustrated in FIG. 3.

This wave generator 145 differs from the previous one only in that the second electrical branch 220 of the resonant circuit 200, with the relative resonance capacity 230, extends between the central electrical node 215 and a further terminal 235 connected to the reference voltage.

Figure 5:
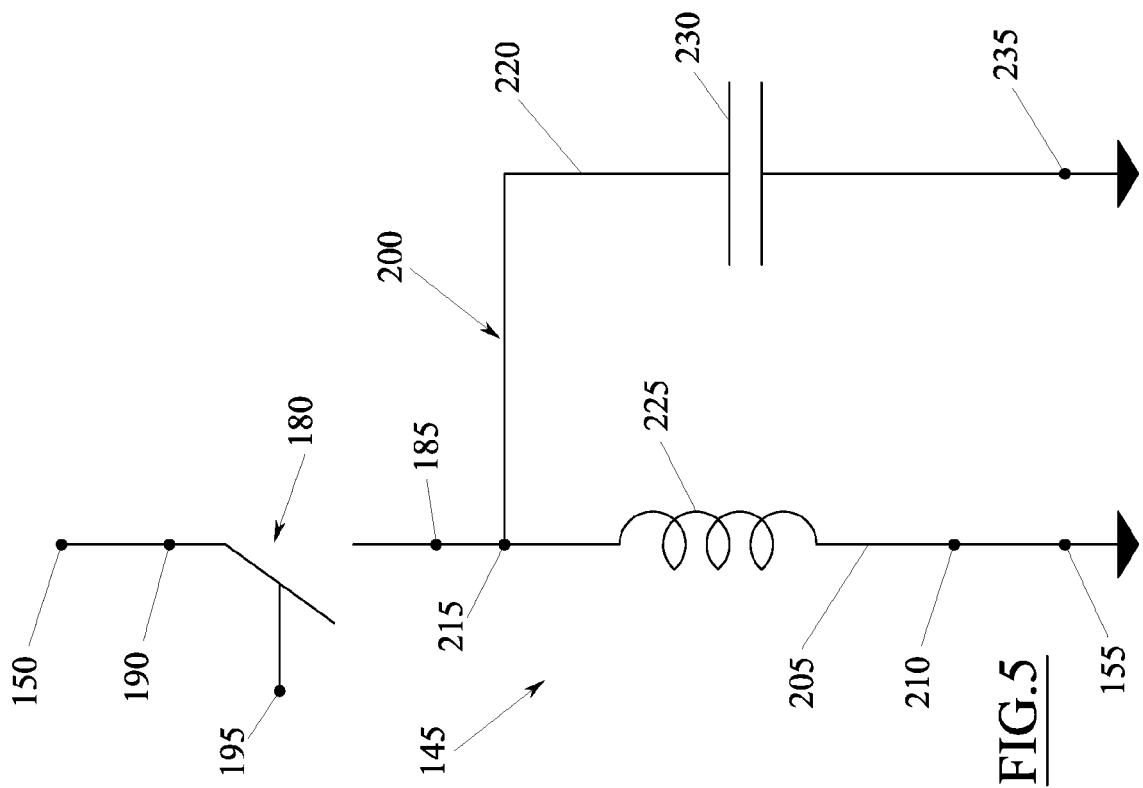
FIGS. 4 and 5 show two variants respectively of the wave generator of FIG. 2 and of FIG. 3.

A variant of both of the wave generators 145 described above is illustrated respectively in FIG. 4 and in FIG. 5.

Figure 4:
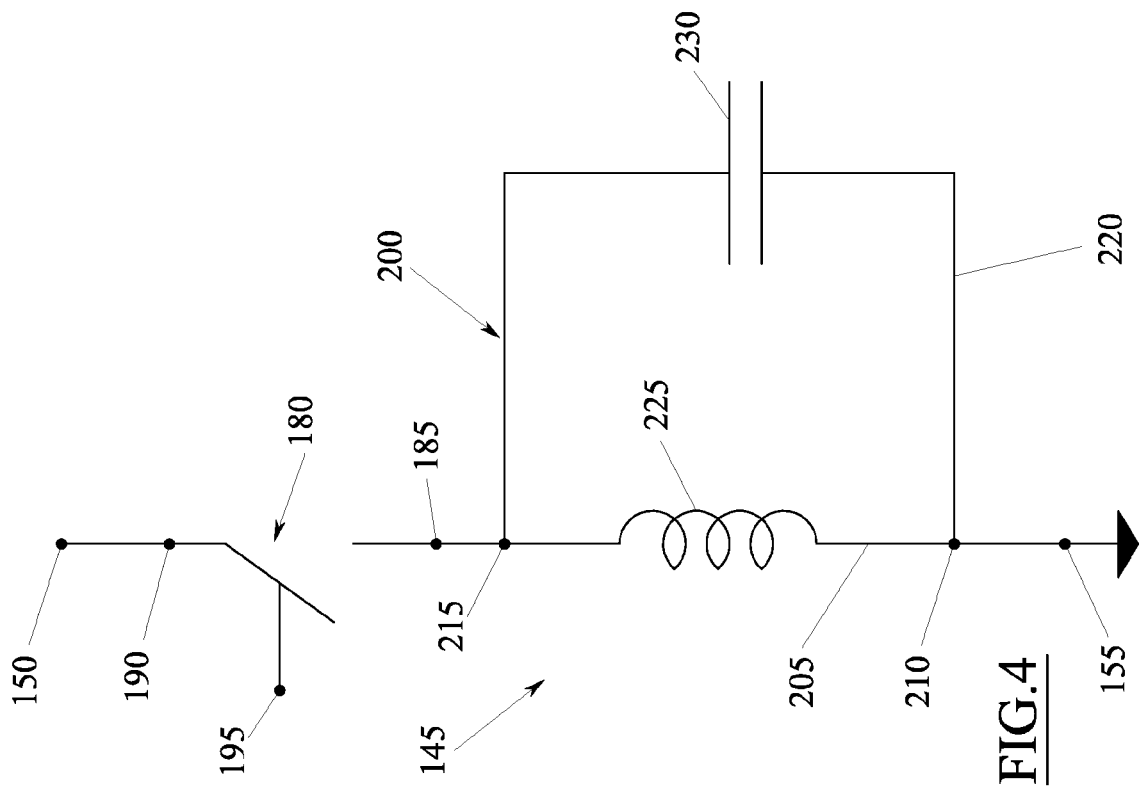

The schemes of FIGS. 4 and 5 differ from those of FIGS. 2 and 3 only in that the first terminal 210 of the resonant circuit 200 is connected to the reference voltage and that the second connection terminal 190 of the active switch 180 is connected to (i.e. coincides with) the first input terminal 150 of the wave generator 145.

In this way, wave generators 145 are obtained having operation analogous to those of FIGS. 2 and 3 but with the drawback that the active switch 180 is connected in a floating manner and is thus more difficult to control, requiring for example the use of a p-MOS or of an n-MOS controlled through a suitable bootstrap circuit.

For this reason, although in all of the implementations that will be illustrated hereinafter it is possible to connect the active switch 180 in a floating manner as illustrated in FIG. 4 or 5, it is generally always preferable to connect the active switch 180 to the reference voltage as illustrated in FIGS. 2 and 3 and in all of the examples that will follow.

From the base schemes illustrated in FIGS. 2 and 3, the wave generator 145 can be connected to the electrical load 110 in different ways.

Figure 7:
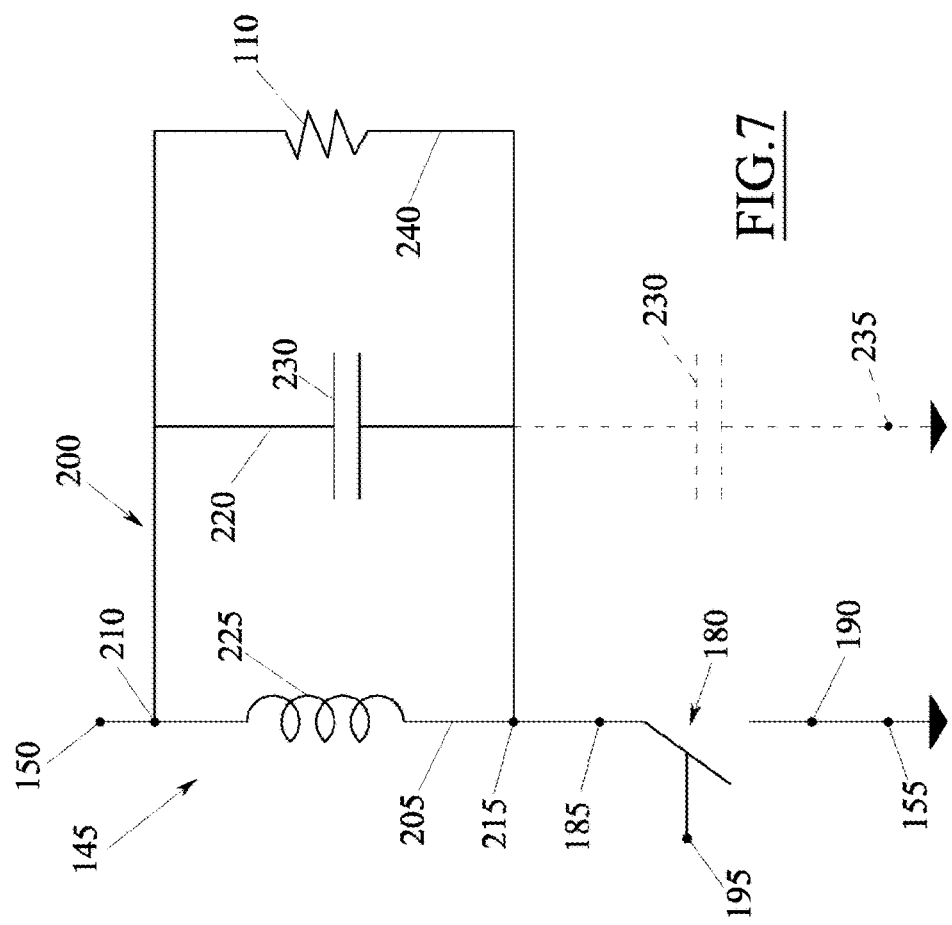
FIG. 7 is the electrical scheme of a first connection mode of the electrical load to the wave generators of FIGS. 1 and 2.

According to a first embodiment illustrated in FIG. 7, the electrical load 110 can be arranged on an electrical connection branch 240, which extends between the first terminal 210 of the resonant circuit 200 and the central electrical node 215, so that the electrical load 110 is substantially connected in parallel with the resonance inductance 225.

The resonance capacity 230 can be connected in parallel to the resonance inductance 225 according to the scheme of FIG. 2 (solid line), or it can be equivalently connected to the reference voltage according to the scheme of FIG. 3 (dashed line).

It should be noted that in the embodiment of FIG. 7, the electrical load 110 is connected so as to directly receive the voltage wave generated by the wave generator 145 and thus be fed substantially with an alternating voltage.

If, however, it is necessary to feed the electrical load 110 with a substantially direct voltage, it is advantageously possible to insert the rectifier 175 along the electrical connection branch 240 upstream of the electrical load 110, as illustrated in FIG. 8.

In both of the embodiments illustrated in FIGS. 7 and 8, the electrical load 110 is galvanically connected to the direct voltage source 105, making a non-insulated system.

The schemes described above can, however, be modified so as to place the direct voltage source 105 in a primary electric circuit and the electrical load 110 in a secondary circuit that is galvanically insulated with respect to the primary circuit.

For example, FIG. 9 illustrates a circuit scheme that differs from that of FIG. 8 for the presence of two insulation capacities, including a first insulation capacity 250 arranged on the electrical connection branch 240 between the first terminal 210 and the electrical load 110, for example between the first terminal 210 and rectifier 175, and a second insulation capacity 255 arranged on the electrical connection branch 240 between the electrical load 110 and the central electrical node 215, for example between the rectifier 175 and the central electrical node 215.

The value of the two insulation capacities 250 and 255 is preferably much greater with respect to the value of the resonance capacity 230, so as not to interfere with the resonance frequency of the resonant circuit 200.

For example, the value of the insulation capacities 250 and 255 can be selected of the order of hundreds of nF or of uF, with resonance frequencies of the order of MHz. In this way, the two insulation capacities 250 and 255 are capable of completely galvanically insulating the primary circuit, comprising the direct voltage source 105 and the wave generator 145, from the secondary circuit, comprising the electrical load 110 and the rectifier 175.

At the same time, the insulation capacities 250 and 255 electrically couple the primary circuit with the secondary circuit in a capacitive manner, allowing the voltage wave generated by the wave generator 145 to be transmitted to the electrical load 110.

In some embodiments, the two insulation capacities 250 and 255 can be discreet capacities, i.e. inseparable components comprising a first terminal connected to the primary circuit and a second terminal connected to the secondary circuit.

In this way, the system 100 can be made in the form of a single and indivisible device, like for example an insulated electrical converter.

In other embodiments, each insulation capacity 250 and 255 can be made from a pair of mutually separable plates, including a transmission plate connected to the primary circuit and a receiving plate connected to the secondary circuit.

In this way, the primary circuit, comprising the direct voltage source 105, the wave generator 145 and the transmission plates, can be installed in a first device, whereas the secondary circuit, comprising at least the electrical load 110, the rectifier 175 and the receiving plates, can be installed on a second device, physically separate and mobile (apart) with respect to the first device.

For example, the first device could be configured as a recharging base whereas the second device could be a device to be charged or to be fed, like a smartphone, a portable computer, a television set and much more.

In this way, by suitably bringing the second device towards the first device it would be possible to bring together and interface each transmission plate with a corresponding receiving plate, reconstituting the insulation capacities 250 and 255 and thus making a wireless transmission system of the electrical power in a capacitive manner.

In other embodiments, the galvanic insulation between the primary circuit and the secondary circuit could be made through an inductive coupling system.

Figure 10:
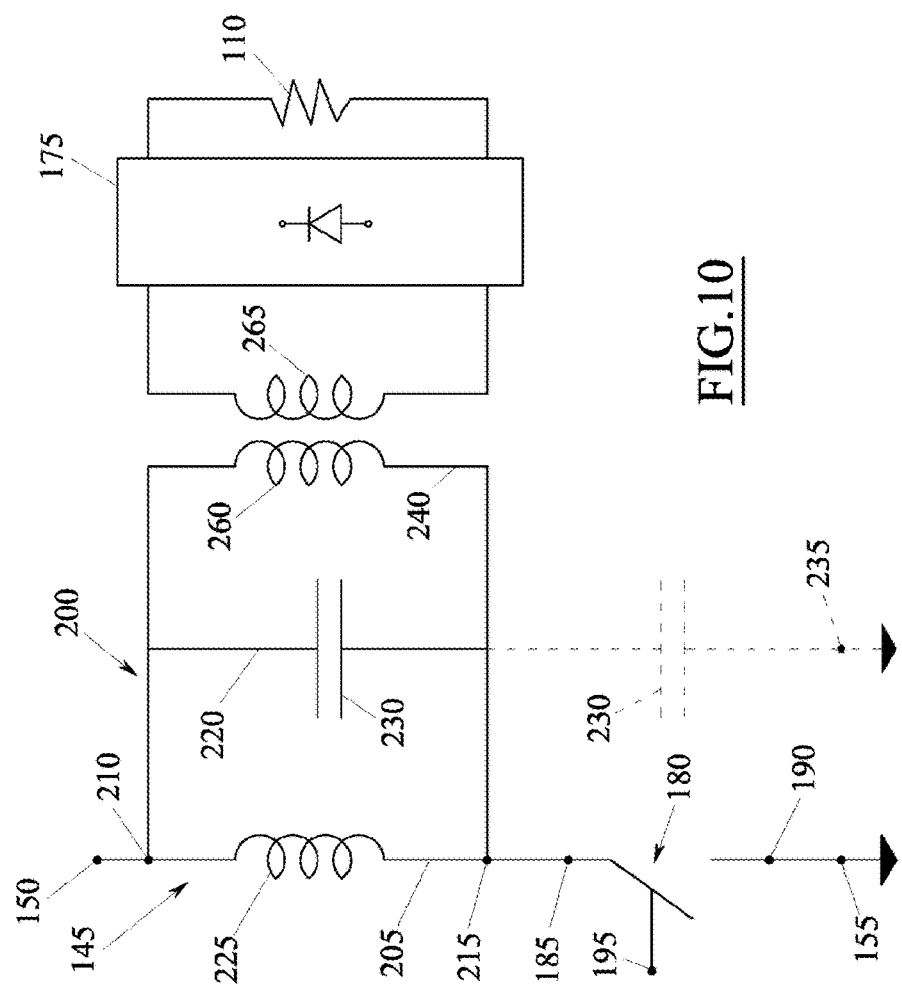

For example, FIG. 10 illustrates a circuit scheme that differs from that of FIG. 6 in that on the electrical connection branch 240 there is a coupling inductance 260 adapted for making an inductive coupling, i.e. through electromagnetic induction, with a corresponding coupling inductance 265 connected in closed circuit with the electrical load 110, for example with the interposition of the rectifier 175.

The value of the two coupling inductances 260 and 265 is preferably much greater with respect to the value of the resonance inductance 225, so as not to interfere with the resonance frequency of the resonant circuit 200.

In this way, the two coupling inductances 260 and 265 are capable of completely galvanically insulating the primary circuit, comprising the direct voltage source 105 and the wave generator 145, from the secondary circuit, comprising the electrical load 110 and the rectifier 175.

At the same time, the coupling inductances 260 and 265 electrically connect the primary circuit to the secondary circuit in an inductive manner, allowing the voltage wave generated by the wave generator 145 to be transmitted to the electrical load 110.

In some embodiments, the coupling inductances 260 and 265 can at least partially respectively consist of the primary winding and of the secondary winding of a transformer, for example wound around a same magnetic core.

In this way, the system 100 can be made in the form of a single and inseparable device, like for example an insulated electric converter.

In other embodiments, each coupling inductance 260 and 265 can at least partially respectively consist of a wireless transmission coil (e.g. antenna) and of a wireless receiving coil (e.g. antenna) of the electrical power.

In this way, the primary circuit, comprising the direct voltage source 105, the wave generator 145 and the coupling inductance 260, can be installed in a first device (e.g. charging base), whereas the secondary circuit, comprising at least the electrical load 110, the rectifier 175 and the coupling inductance 265, can be installed on a second device (e.g. smartphone, portable computer or television set), physically separate and mobile (apart) with respect to the first device.

In this way, by suitably bringing the second device towards the first device it is possible to re-establish the inductive coupling between the coupling inductances 260 and 265, which thus make a wireless transmission system of the electrical power in an inductive manner.

It should be observed here that, although the insulated solutions described with reference to FIGS. 9 and 10 provide for the presence of the rectifier 175, the latter could be omitted if it is required to feed the electrical load 110 with an alternating voltage.

Moreover, although the aforementioned insulated solutions provide (in a solid line) that the resonance capacity 230 be connected in parallel with the resonance inductance 225, alternatively the resonance capacity 230 could be connected to the reference voltage (dashed line).

Figure 11:
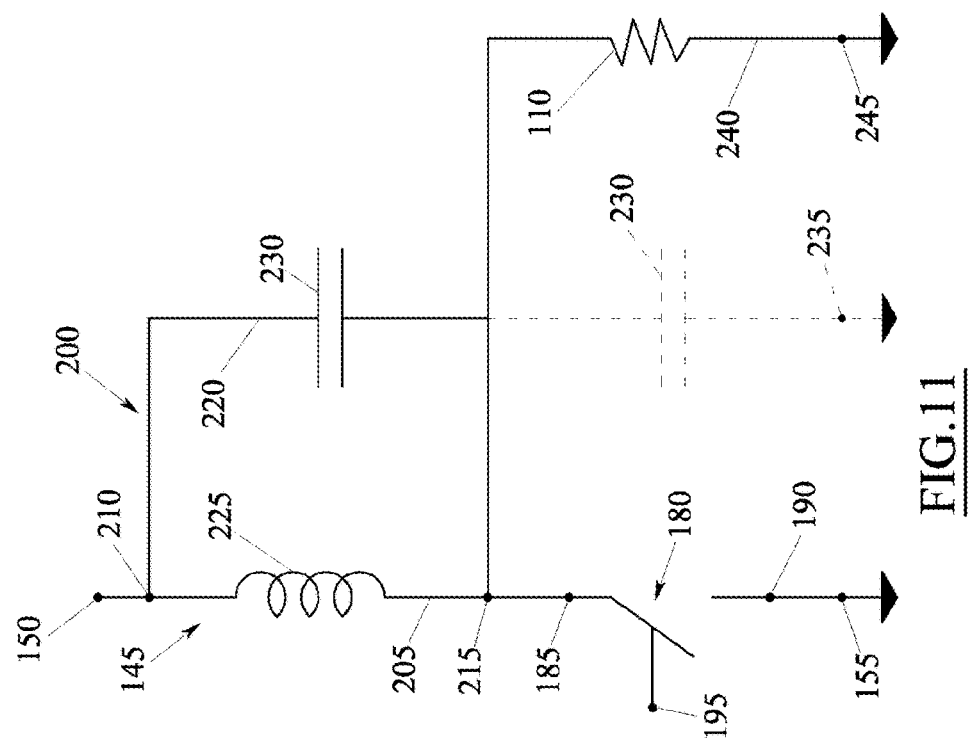
FIG. 11 is the electrical scheme of a second connection mode of the electrical load to the wave generators of FIGS. 1 and 2.

As illustrated in FIG. 11, a second way to connect the electrical load 110 to the wave generators 145 illustrated in the schemes of FIGS. 2 and 3 provides that the electrical connection branch 240, on which the electrical load 110 is arranged, extends from the central electrical node 215 of the resonant circuit 200 and a further terminal 245 connected with the reference voltage.

With respect to the embodiment of FIG. 7, this solution therefore has the substantial advantage of having the electrical load 110 referred to the reference voltage instead of floating.

Also in this case, the resonance capacity 230 can be connected in parallel to the resonance inductance 225 according to the scheme of FIG. 2 (solid line), or it can be equivalently connected to the reference voltage according to the scheme of FIG. 3 (dashed line).

According to the scheme of FIG. 11, the electrical load 110 directly receives the voltage wave generated by the wave generator 145 and is thus fed substantially in alternating voltage.

Figure 12:
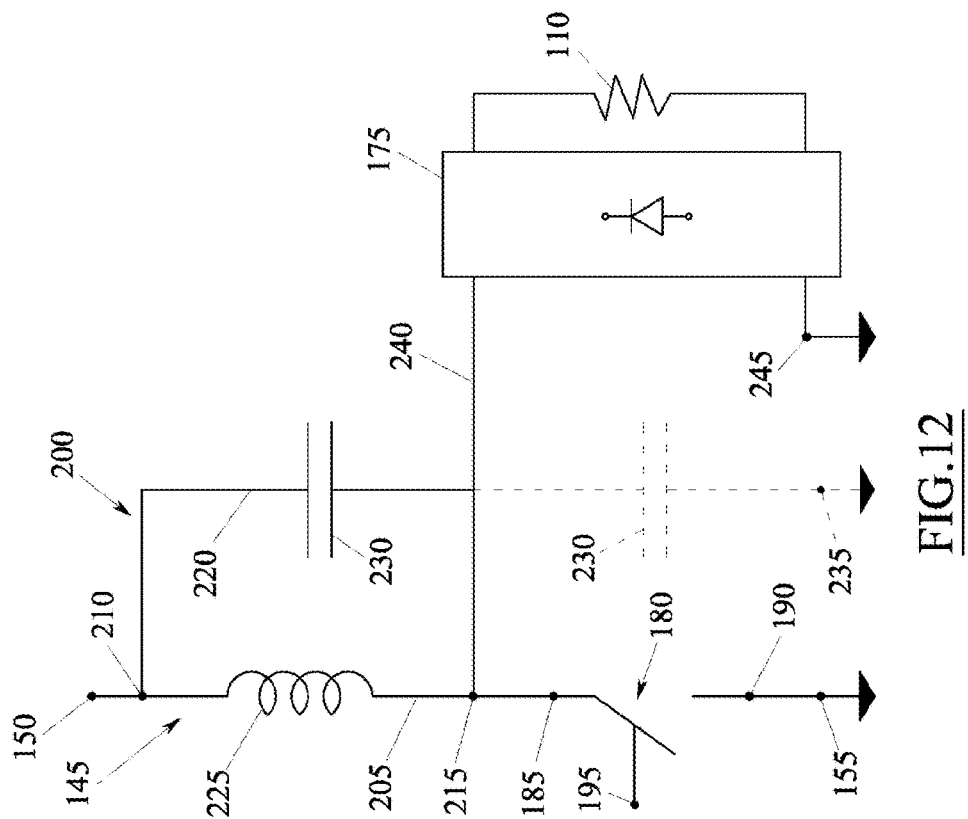

If, however, it is necessary to feed the electrical load 110 with a substantially direct voltage, it is advantageously possible to insert the rectifier 175 along the electrical connection branch 240 upstream of the electrical load 110, as illustrated in FIG. 12. In the solutions described with reference to FIGS. 11 and 12, the electrical load 110 is galvanically connected to the direct voltage source 105, making a non-insulated system.

Also in this case, it is however possible to modify each of the schemes described above, so that the direct voltage source 105 is arranged in a primary circuit and so that the electrical load 110 is arranged in a secondary circuit galvanically insulated with respect to the primary circuit.

Figure 13:
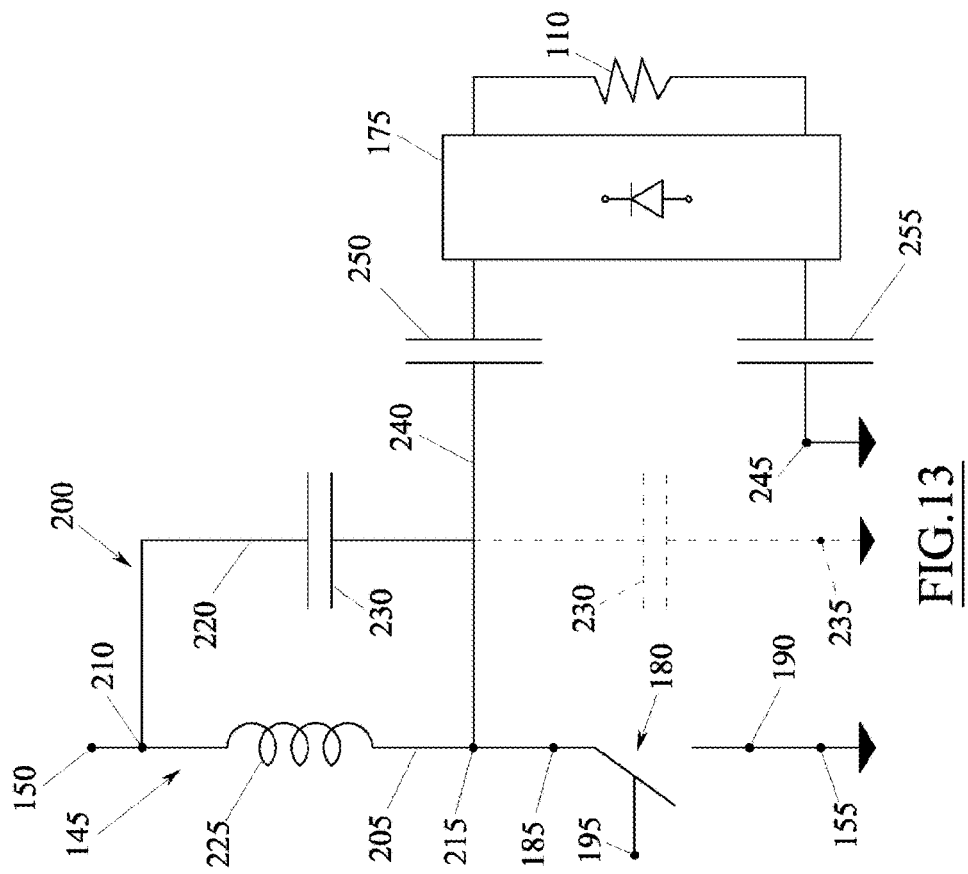

For example, FIG. 13 illustrates a circuit scheme that differs from that of FIG. 12 for the presence of two insulation capacities, including a first insulation capacity 250 arranged on the electrical connection branch 240 between the central electrical node 215 and the electrical load 110, for example between the central electrical node 215 and rectifier 175, and a second insulation capacity 255 arranged on the electrical connection branch 240 between the electrical load 110 and the terminal 245 connected to the reference voltage, for example between the rectifier 175 and said terminal 245.

The value of the two insulation capacities 250 and 255 is preferably much greater with respect to the value of the resonance capacity 230, so as not to interfere with the resonance frequency of the resonant circuit 200, for example of the order of hundreds of nF or uF, with resonance frequencies of the order of MHz.

In this way, the two insulation capacities 250 and 255 are capable of completely galvanically insulating the primary circuit, comprising the direct voltage source 105 and the wave generator 145, from the secondary circuit, comprising the electrical load 110 and the rectifier 175.

At the same time, the insulation capacities 250 and 255 electrically couple the primary circuit with the secondary circuit in a capacitive manner, allowing the voltage wave generated by the wave generator 145 to be transmitted to the electrical load 110.

In some embodiments, the two insulation capacities 250 and 255 can be discreet capacities.

In other embodiments, each insulation capacity 250 and 255 can be made from a pair of mutually separable plates, including a transmission plate connected to the primary circuit and a receiving plate connected to the secondary circuit.

In this way, the primary circuit, comprising the direct voltage source 105, the wave generator 145 and the transmission plates, can be installed in a first device (e.g. charging base), whereas the secondary circuit, comprising at least the electrical load 110, the rectifier 175 and the receiving plates, can be installed on a second device (e.g. smartphone, portable computer or television set), physically separate and mobile (apart) with respect to the first device.

In this way, by suitably bringing the second device towards the first device it is possible to bring together and interface each transmission plate with a corresponding receiving plate, reconstituting the insulation capacities 250 and 255 that thus make a wireless transmission system of the electrical power in a capacitive manner.

If, however, it is not necessary to make a wireless transmission of the electrical power and/or it is not necessary to have complete galvanic insulation between the primary circuit and the secondary circuit, the insulation capacity 255 could be eliminated as illustrated in FIG. 14.

In this way, there would be a single insulation capacity 250 adapted for acting as block of the direct voltage, which is arranged on the electrical connection branch 240 between the central electrical node 215 and the electrical load 110, for example between the central electrical node 215 and rectifier 175.

Alternatively, it would equivalently be possible to omit the insulation capacity 250 and only leave the insulation capacity 255 adapted for acting as block of the direct voltage.

In other embodiments, the galvanic insulation between the primary circuit and the secondary circuit could be made through an inductive coupling system.

For example, FIG. 15 illustrates a circuit scheme that differs from that of FIG. 11 in that on the electrical connection branch 240 there is a coupling inductance 260 adapted for making an inductive coupling, i.e. through electromagnetic induction, with a corresponding coupling inductance 265 connected in closed circuit with the electrical load 110, for example with the interposition of the rectifier 175.

The value of the two coupling inductances 260 and 265 is preferably much greater with respect to the value of the resonance inductance 225, so as not to interfere with the resonance frequency of the resonant circuit 200.

In this way, the two coupling inductances 260 and 265 are capable of completely galvanically insulating the primary circuit, comprising the direct voltage source 105 and the wave generator 145, from the secondary circuit, comprising the electrical load 110 and the rectifier 175.

At the same time, the coupling inductances 260 and 265 electrically connect the primary circuit to the secondary circuit in an inductive manner, allowing the voltage wave generated by the wave generator 145 to be transmitted to the electrical load 110.

In some embodiments, the coupling inductances 260 and 265 can at least partially consist, respectively, of the primary winding and of the secondary winding of a transformer, for example wound around a same magnetic core.

In this way, the system 100 can be made in the form of a single and inseparable device, like for example an insulated electric converter.

In other embodiments, each coupling inductance 260 and 265 can at least partially consist, respectively, of a wireless transmission coil (e.g. antenna) and of a wireless receiving coil (e.g. antenna) of the electrical power.

In this way, the primary circuit, comprising the direct voltage source 105, the wave generator 145 and the coupling inductance 260, can be installed in a first device (e.g. charging base), whereas the secondary circuit, comprising at least the electrical load 110, the rectifier 175 and the coupling inductance 265, can be installed on a second device (e.g. smartphone, portable computer or television set), physically separate and mobile (apart) with respect to the first device.

In this way, by suitably bringing the second device towards the first device it is possible to re-establish the inductive coupling between the coupling inductances 260 and 265, which thus make a wireless transmission system of the electrical power in an inductive manner.

Although all of the insulation solutions described with reference to FIGS. 13, 14 and 15 provide for the presence of the rectifier 175, the latter could be omitted if it is required to feed the electrical load 110 with an alternating voltage.

Moreover, although the aforementioned solutions provide that the resonance capacity 230 is connected in parallel with the resonance inductance 225 (solid line), alternatively the resonance capacity 230 could be connected to the reference voltage (dashed line).

Figure 16:
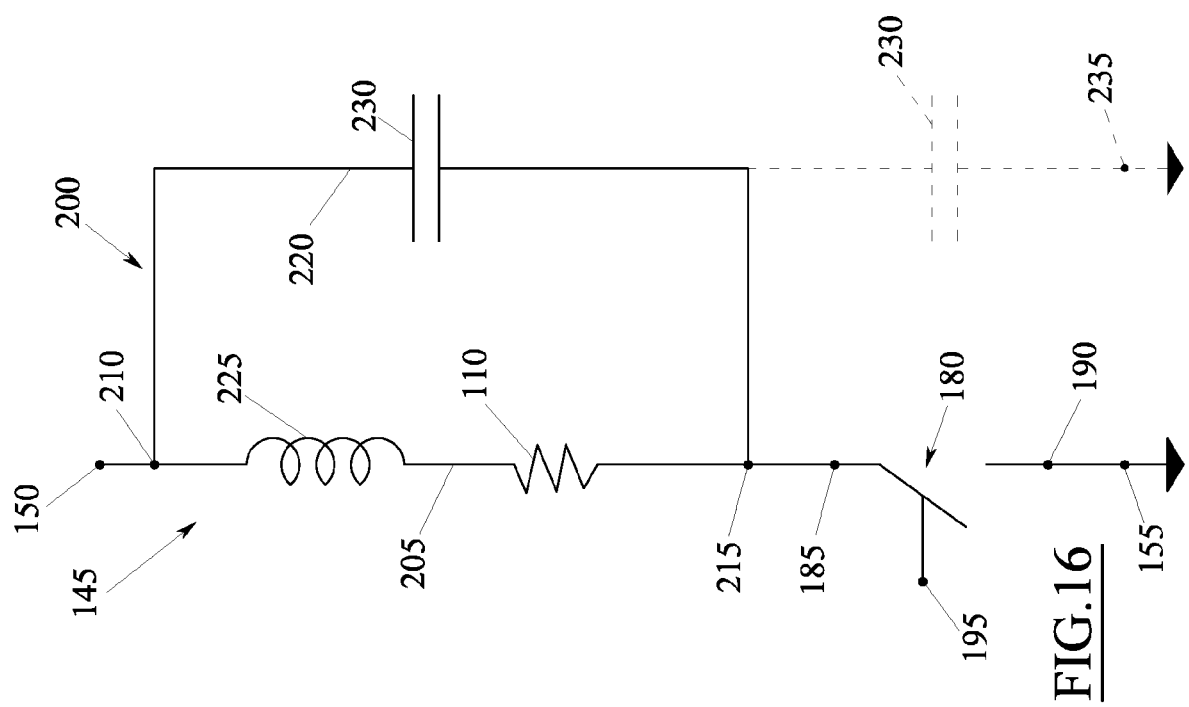
FIG. 16 is the electrical scheme of a third connection mode of the electrical load to the wave generators of FIGS. 1 and 2.

A third way of connecting the electrical load 110 to the wave generators 145 illustrated in the schemes of FIGS. 2 and 3 is represented in FIG. 16 and provides that the electrical load 110 can be arranged directly on the first electrical branch 205 in series with the resonance inductance 225.

Also in this case, the resonance capacity 230 can be connected in parallel to the resonance inductance 225 according to the scheme of FIG. 2 (solid line), or it can be equivalently connected to the reference voltage according to the scheme of FIG. 3 (dashed line).

In the scheme of FIG. 16, the electrical load 110 is connected so as to directly receive the voltage wave generated by the wave generator 145 and thus be fed substantially in alternating voltage.

Figure 17:
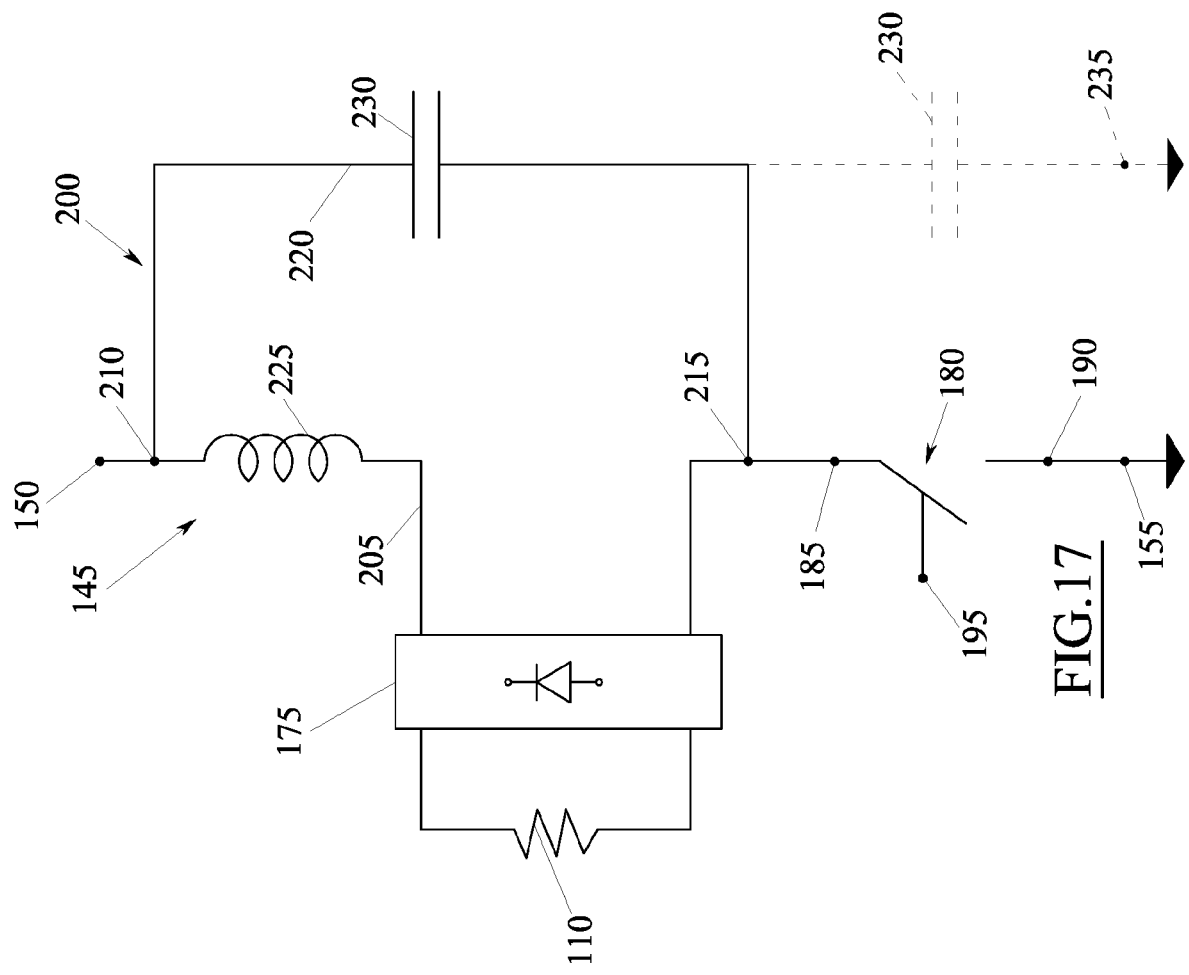
FIGS. 17 to 21 show as many variants to the scheme of FIG. 16.

If, however, it is necessary to feed the electrical load 110 with a substantially direct voltage, it is advantageously possible to insert the rectifier 175 along the first electrical branch 205 upstream of the electrical load 110, as illustrated in FIG. 17.

From these non-insulated schemes it is also possible to develop solutions in which the direct voltage source 105 is arranged on a primary circuit and in which the electrical load 110 is arranged in a secondary circuit, which is galvanically insulated with respect to the primary circuit.

Figure 18:
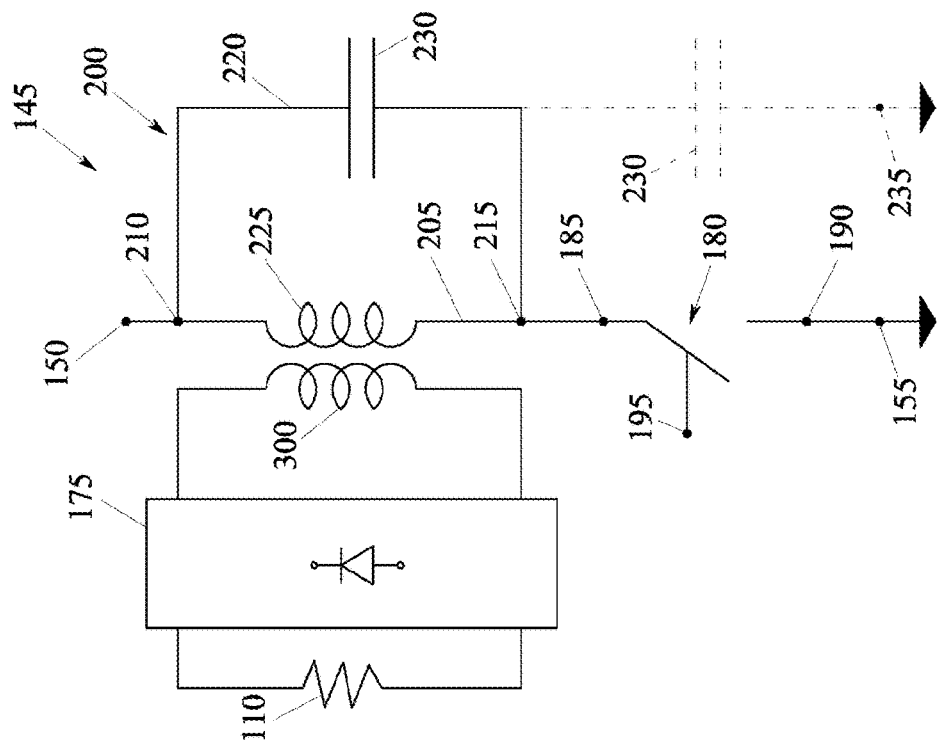

For example, FIG. 18 illustrates a circuit scheme that differs from that of FIG. 17 in that the resonance inductance 225, arranged on the first electrical branch 205, is adapted for making an inductive coupling, i.e. through electromagnetic induction, with a corresponding coupling inductance 300, which is connected in closed circuit with the electrical load 110, for example with the interposition of the rectifier 175.

In this way, the resonance inductance 225 and the coupling inductance 300 are capable of completely galvanically insulating the primary circuit, comprising the direct voltage source 105 and the wave generator 145, from the secondary circuit, comprising the electrical load 110 and the rectifier 175.

At the same time, the resonance inductance 225 and the coupling inductance 300 electrically connect the primary circuit to the secondary circuit in an inductive manner, allowing the voltage wave generated by the wave generator 145 to be transmitted to the electrical load 110.

With respect to the inductively insulated systems illustrated in FIGS. 9 and 14, this solution makes it possible to reduce the number of components, since one of the coupling inductances coincides with the resonance inductance 225, and also makes it possible to substantially reduce the size and the costs of the entire system, since the inductances 225 and 300 of the scheme of FIG. 18, also having the function of resonance inductances, can be much smaller than those used in the previous schemes.

Observing the scheme of FIG. 18, it is indeed clear how the overall resonance inductance is given, not only by the inductance indicated as resonance inductance 225 of the primary circuit, but also by the coupling inductance 300 of the secondary circuit, which is magnetically coupled with a coupling coefficient k typically lower than one (where k=1 would correspond to an ideal coupling).

Similarly to the previous cases, some embodiments can provide that the resonance inductance 225 and the coupling inductance 300 at least partially consist, respectively, of the primary winding and of the secondary winding of a transformer, for example wound around a same magnetic core.

Other embodiments can, on the other hand provide that the resonance inductance 225 and the coupling inductance 300 can at least partially consist, respectively, of a wireless transmission coil (e.g. antenna) and of a wireless receiving coil (e.g. antenna) of the electrical power.

In this way, the primary circuit, comprising at least the direct voltage source 105, the wave generator 145 and the resonance inductance 225, can be installed in a first device, whereas the secondary circuit, comprising at least the electrical load 110, the rectifier 175 and the coupling inductance 300, can be installed on a second device, physically separate and mobile (apart) with respect to the first device.

For example, the first device could be configured as a charging base whereas the second device could be a device to be charged or to be fed, like a smartphone, a portable computer, a television set and much more.

In this way, by suitably bringing the second device towards the first device it is possible to re-establish the inductive coupling between the resonance inductance 225 and the coupling inductance 300, which thus make a wireless transmission system of the electrical power in an inductive manner.

Although the solution of FIG. 18 provides that the resonance capacity 230 is connected in parallel with the resonance inductance 225 (solid line), alternatively the resonance capacity 230 could be connected to the reference voltage (dashed line).

From the insulated scheme illustrated above it is also possible to develop conceptually analogous schemes but based on a greater number of phases, for example but not exclusively based on two phases.

Figure 19:
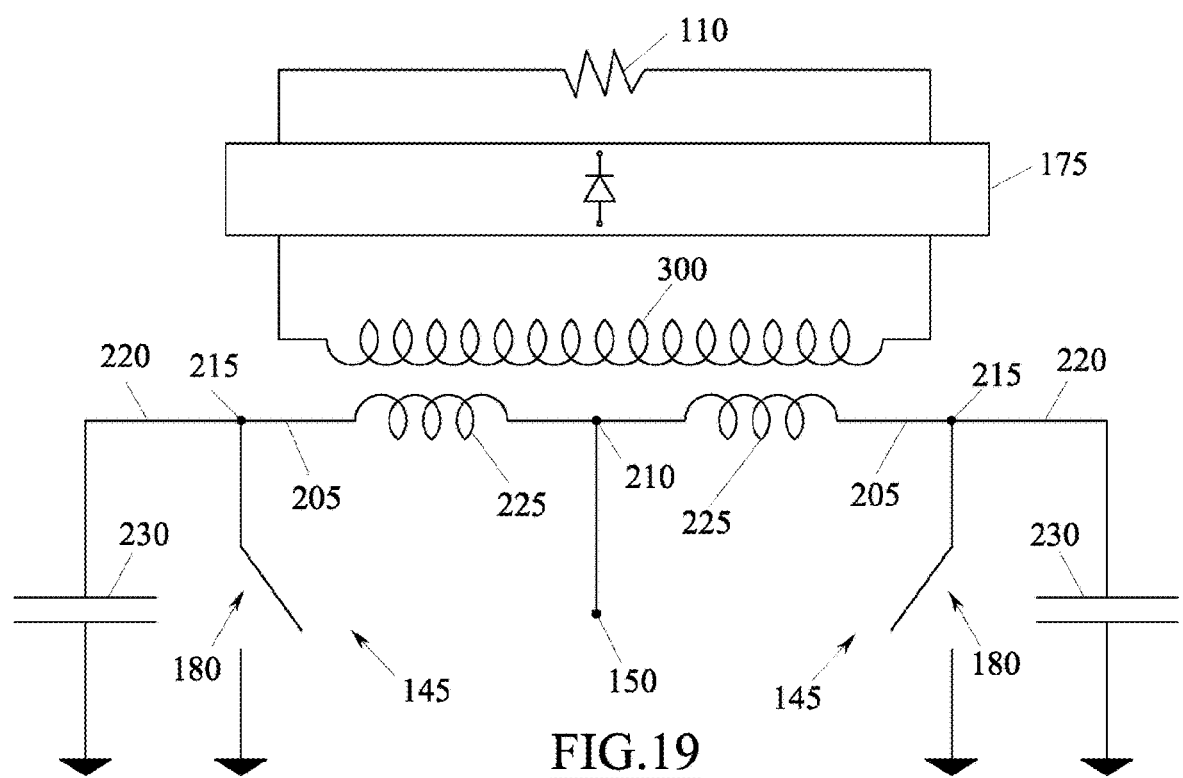

An example of this solution is illustrated in FIG. 19, in which the system 100 comprises at least two wave generators 145 of the type of the one illustrated in FIG. 18.

In particular, the first terminals 210 of both the wave generators 145 can coincide and form a single common node, which is connected with the first input terminal 150, i.e. with the direct voltage source 105, whereas the active switches 180 and the resonance capacities 230 can be connected to the reference voltage.

Figure 20:
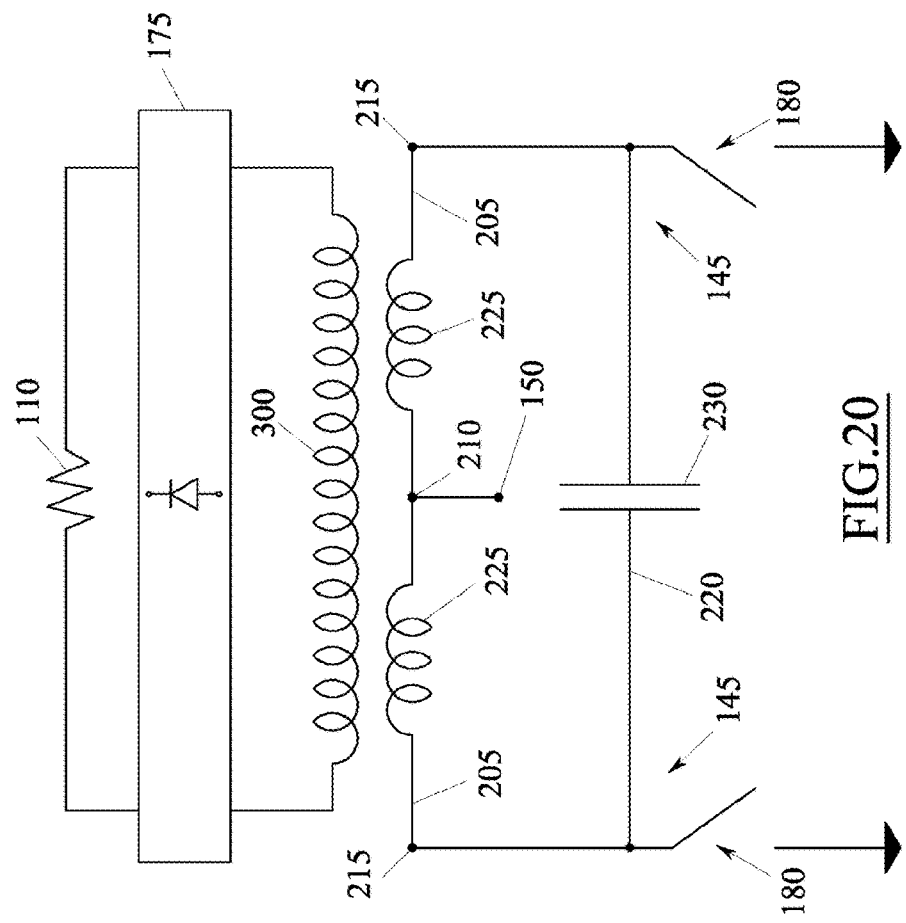

Of course, the resonance capacities 230 could alternatively be connected in parallel to the corresponding resonance inductances 225 and possibly be replaced by a single resonance capacity 230 having the terminals respectively connected to the central electric nodes 215 of the two wave generators 145, as illustrated in FIG. 20.

Regardless of these considerations, the resonance inductance 225 arranged on the first electrical branch 205 of each wave generator 145 can be adapted for making an inductive coupling, i.e. through electromagnetic induction, with a corresponding coupling inductance 300, which is connected in closed circuit with the electrical load 110, for example with the interposition of the rectifier 175.

Also in this case, the inductive coupling between the resonance inductances 225 and the coupling inductance 300 can be obtained through transformer or through a wireless transfer solution, exactly as described earlier.

The active switches 180 can be controlled through respective control signals, so as to turn on and off with the same frequency but not in phase with each other, i.e. so that the active switches 180 are not always turned on or off simultaneously but there is always at least a small time lapse, within every operating period, in which one active switch 180 is turned on and the other is turned off and vice-versa.

In this way, by suitably adjusting this time lapse, i.e. the dephasing between the control signals of the two active switches 180, it is advantageously possible to increase the power transmitted to the electrical load 110 for the same feed voltage, to reduce the voltage ripple on the electrical load 110 and/or improve the power factor of the circuit.

If the power level to be transferred to the electrical load 110 is particularly high, it is also possible to control the two active switches 180 with control signals in counterphase with one another, so that, when one active switch 180 is turned on, the other is constantly turned off and vice-versa, obtaining a Push-Pull operating mode.

Figure 21:
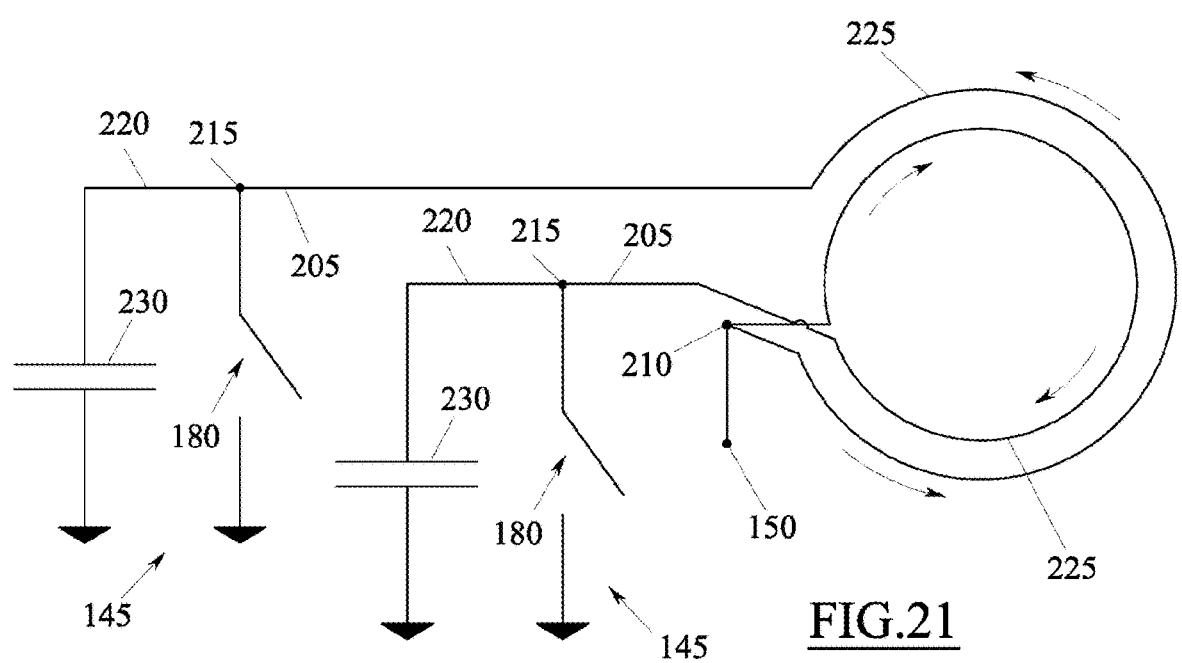

In order that these multi-phase implementations can operate correctly, it is however preferable that, from the common first terminal 210, connected with the feed voltage, the two resonance inductances 225 (i.e. the two primary transformer windings or alternatively the two primary wireless transmission inductive coils) are wound in opposite directions, as illustrated in the scheme of FIG. 21.

For example, the two resonance inductances 225 can be respectively wound with right-handed and left-handed directions.

In this way, it is indeed possible to ensure the inversion of the magnetic field generated by the two resonance inductances 225 and, at the same time, the inversion of the currents, improving the power factor of the circuit and preventing the voltage induced in the inactive resonance inductance 225 making current circulate in the body diode of the active switches 180.

It should be observed here that, although all of the insulated solutions illustrated in FIGS. 18 to 20 provide for the presence of the rectifier 175 in the secondary circuit, such a rectifier 175 could be omitted if it is required to feed the electrical load 110 with an alternating voltage.

Figure 23:
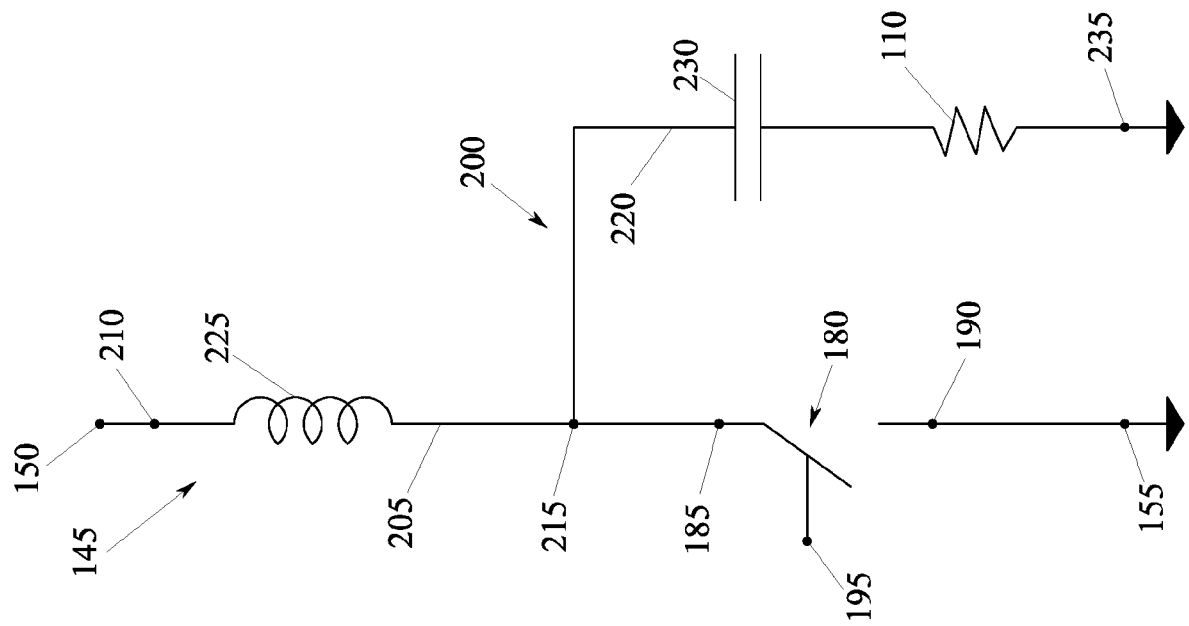
Figure 22:
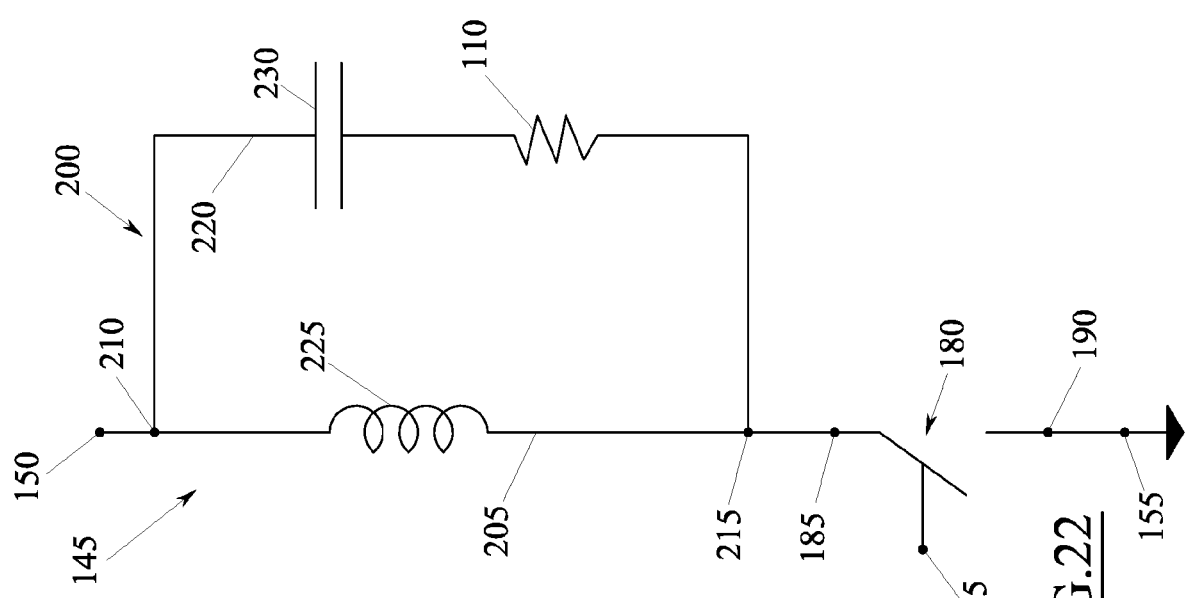
FIG. 22 is the electrical scheme of a fourth connection mode of the electrical load to the wave generators of FIGS. 1 and 2.

As illustrated in FIGS. 22 and 23, a fourth way of connecting the electrical load 110 to the wave generators 145 illustrated in the schemes of FIGS. 2 and 3 provides that the electrical load 110 can be arranged directly on the second electrical branch 220 in series with the resonance capacity 230.

In particular, in the embodiment of FIG. 22, the second electrical branch 220, on which the resonance capacity 230 and the electrical load 110 are arranged in series, extends between the first terminal 210 and the central electrical node 215 of the resonant circuit 200, according to the general scheme of FIG. 2.

In the embodiment of FIG. 23, the second electrical branch 220, on which the resonance capacity 230 and the electrical load 110 are arranged in series, on the other hand extends between the central electrical node 215 of the resonant circuit 200 and the terminal 235 that is connected with the reference voltage, according to the general scheme of FIG. 3.

With respect to the embodiment of FIG. 22, this second variant thus has the substantial advantage of having the electrical load 110 referred to the reference voltage instead of floating.

In the solutions of FIGS. 22 and 23, the electrical load 110 is connected so as to directly receive the voltage wave generated by the wave generator 145 and thus be fed substantially in alternating voltage.

Figure 25:
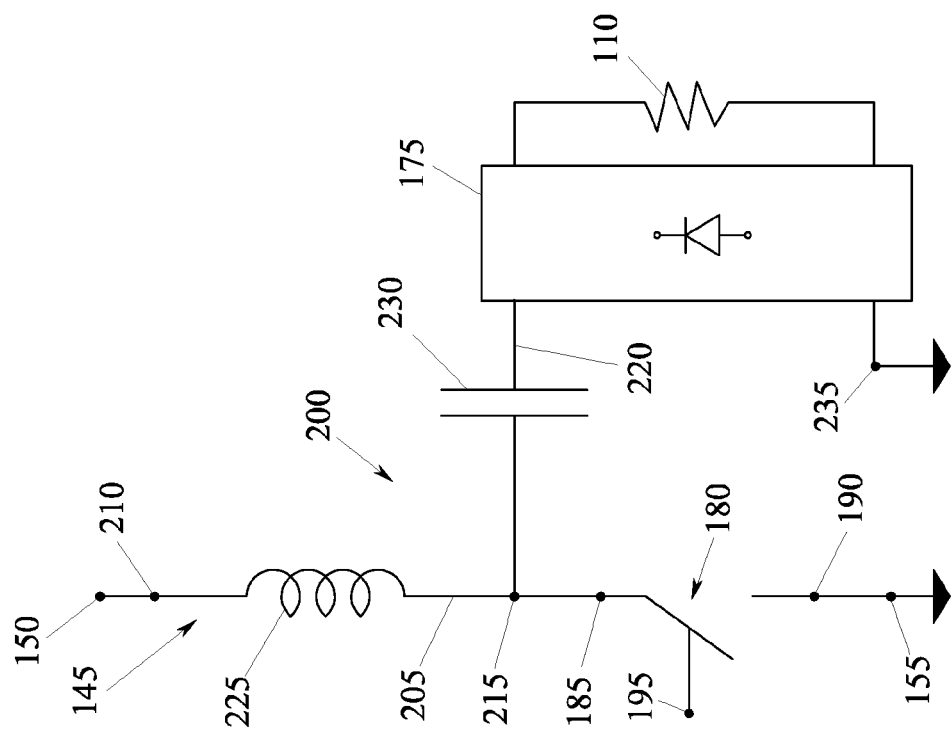
Figure 24:
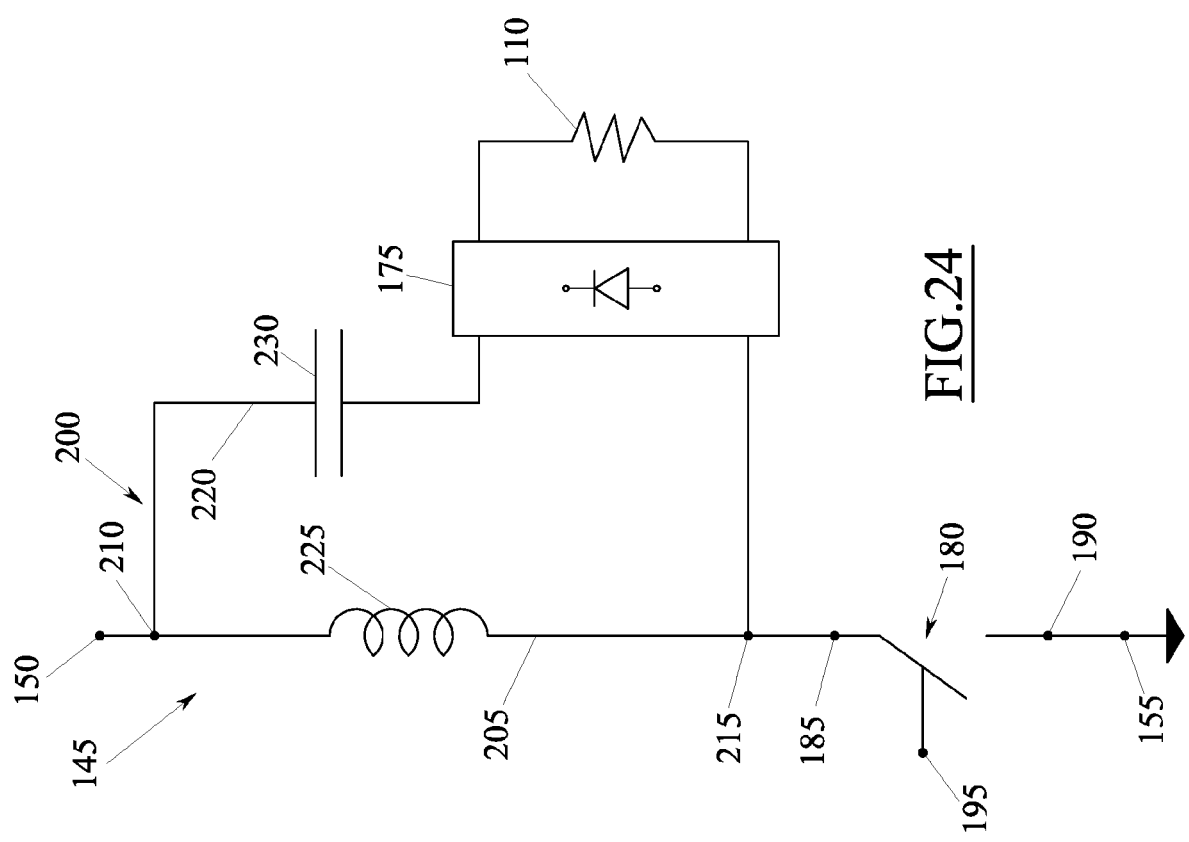

If, however, it is necessary to feed the electrical load 110 with a substantially direct voltage, it is advantageously possible to insert the rectifier 175 along the second electrical branch 220 upstream of the electrical load 110, as illustrated in the examples of FIGS. 24 and 25.

Irrespective of the presence of the rectifier 175, the scheme of FIG. 24 corresponds exactly to the scheme of FIG. 22 whereas the scheme of FIG. 25 corresponds exactly to the scheme of FIG. 23.

According to a particularly advantageous variant, the rectifier 175, which is represented in FIG. 25 as a generic rectification stage, can be made as illustrated in figure 26.

In practice, the rectifier 175 can comprise a diode 305 having anode connected to the reference voltage and cathode connected to an electric node 310 arranged on the second electrical branch 220 between the resonance capacity 230 and the electrical load 110.

The rectifier 175 can also comprise an inductance 315 arranged along the second electrical branch 220 between the electric node 310 and the electrical load 110, and possibly a capacity 320 having a first terminal referred to the reference voltage and a second terminal connected to an electric node 325 arranged between the inductance 315 and the electrical load 110.

Thanks to this solution, a very versatile circuit is made, which is capable of making substantially all of the functionalities of a non-inverting Buck-Boost converter, but that, with respect to a conventional non-inverting Buck-Boost converter, has a smaller number of components, advantageously reducing the bulk and the costs thereof.

Normally, indeed, a non-inverting Buck-Boost converter is made up of two stages in cascade, including a first Boost stage and a second Buck stage, which thus require the presence of at least two active switches and of at least two diodes.

The active switches of this conventional Buck-Boost converter are also floating switches, which are difficult to control and require bootstrap circuits.

Another known solution for obtaining the non-inverting Buck-Boost effect is that of using an SEPIC converter, which however requires an expensive and bulky transformer.

The circuit illustrated in FIG. 26 on the other hand obtains the non-inverting Buck-Boost effect with a very small circuit complexity, comparable with a classic inverting Buck-Boost circuit or with a Cuk converter.

With respect to the Cuk converter, the circuit illustrated in FIG. 26 on the other hand differs for the direction of the diode 305 and, particularly, for a completely different sizing of the reactive components, from which an extremely different operating principle is achieved.

The Cuk converter indeed bases its normal operation on the use of the inductances as continuous sources of current and on the use of these currents for a controlled charging and discharging of the capacitive elements in the sub-phases of the operating period.

On the other hand, the circuit of FIG. 26 is based on the resonance between the resonance inductance 225 and the resonance capacity 230 and on the fact that the resonance capacity 230 is used both as resonance capacity and as barrier for blocking the direct voltage (DC), obtaining waveforms of the voltages and of the electric currents that are completely different from those that can be obtained by the Cuk converter.

This resonant approach of course also reflects on the sizing of the reactive components involved, which are substantially smaller than those of the Cuk converter.

Thanks to the resonance it is also possible to ensure substantially greater efficiency with respect to the Cuk converter, also substantially reducing the electromagnetic emissions (EMI), since the switching of the active switch 180 is of the soft switching type, for example zero voltage switching (ZVS) and/or zero current switching (ZCS).

The voltage wave downstream of the resonance capacity 230 is then rectified by the rectifier 175, in which the inductance 315, unlike the resonance inductance 225, can be sized so as to act substantially as current generator.

In other words, the inductance 315 can have a high inductive value, for example sufficiently large as to make the current ripple negligible with respect to the average current value in the inductance 315 itself. Of course, the scheme illustrated in FIG. 26, in which the rectifier 175 is made up of a simple diode 35 and a filter LC formed by the inductance 315 and by the capacity 320, represents the simplest version of the non-inverting Buck-Boost circuit that can be obtained from the wave generator 145 proposed above.

In other more complex and more efficient embodiments from the energy point of view—at least for low current values, the diode 305 could for example be replaced with a further active switch controlled so as to make a synchronous rectification.

Also in this case, the circuit would not however be particularly complex, since the further active switch would be referred to the reference potential and would thus be extremely simple to control even at high frequency.

A possible variant that makes it possible to further increase the performance of the Buck-Boost circuit of FIG. 26 consists of also making the rectifier 175 resonant, in a similar way to what is made with a rectifier in class E or in any case with resonant rectifiers.

In terms of the circuit, the scheme would remain substantially the same (possibly with further reactive components useful for simplifying the tuning, for example one or more further capacities in parallel with the diode 305), but the inductance 315 would have a reduced inductive value, useful in particular for resonating with the remaining circuit network, in order to reduce and possibly zero the dynamic losses in the diode 305 or, in the case of synchronous rectification, in the further active switch that would replace the diode 305.

From the schemed illustrated in FIGS. 22 to 26 it is also possible to develop the insulated solutions, in which the direct voltage source 105 is arranged in a primary circuit and in which the electrical load 110 is arranged in a secondary circuit, which is galvanically insulated with respect to the primary circuit but is electrically coupled with it through a capacitive coupling system.

Figure 27:
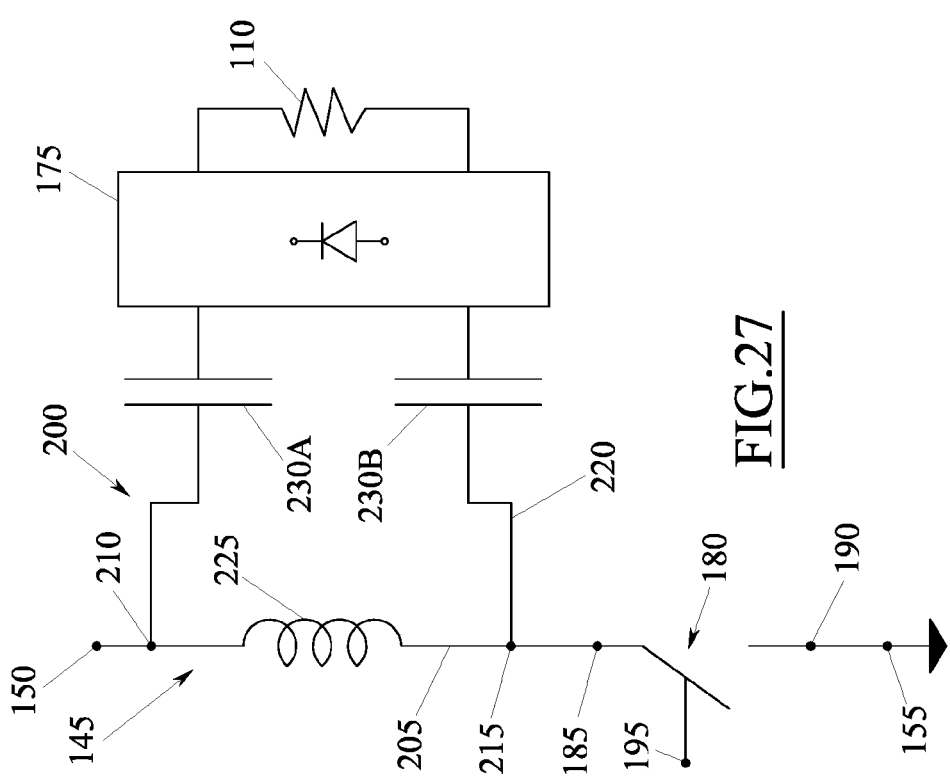

For example, FIG. 27 illustrates a circuit scheme identical to that of FIG. 24 with the exception of the fact that the resonance capacity 230 is divided into two resonance capacities 230A and 230B, which are arranged on the second electrical branch 220, respectively between the first terminal 210 of the resonant circuit 200 and the electrical load 110, for example upstream of the rectifier 175, and between the electrical load 110 and the central electrical node 215, for example downstream of the rectifier 175.

In this way, the two resonance capacities 230A and 230B also act as insulation capacities and are capable of completely galvanically insulating the primary circuit, comprising the direct voltage source 105 and the wave generator 145, from the secondary circuit, comprising the electrical load 110 and the rectifier 175.

At the same time, the resonance capacities 230A and 230B electrically connect the primary circuit to the secondary circuit in a capacitive manner, allowing the voltage wave generated by the wave generator 145 to be transmitted to the electrical load 110.

Figure 28:
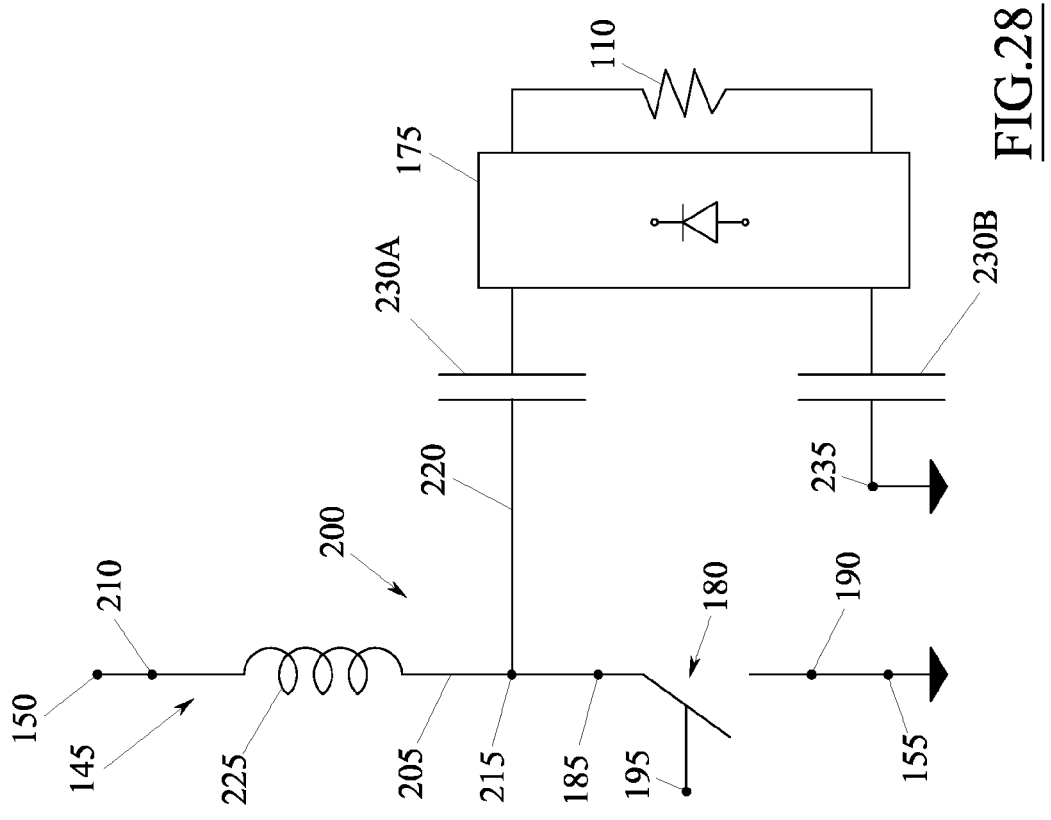

An alternative solution, but that achieves the same effects outlined above, is illustrated in FIG. 28 and provides for a circuit scheme identical to that of FIG. 25 (and thus possibly able to be made like that of FIG. 26) with the exception of the fact that, also in this case, the resonance capacity 230 is divided into two resonance capacities 230A and 230B, which are arranged on the second electrical branch 220, respectively between the central electrical node 215 of the resonant circuit 200 and the electrical load 110, for example upstream of the rectifier 175, and between the electrical load 110 and the terminal 235 that is connected to the reference voltage, for example downstream of the rectifier 175.

In both of the illustrated embodiments, the two resonance capacities 230A and 230B can be discreet capacities, i.e. inseparable components comprising a first terminal connected to the primary circuit and a second terminal connected to the secondary circuit.

In this way, the system 100 can be made in the form of a single and inseparable device, like for example an insulated electric converter.

In other embodiments, each resonance capacity 230A and 230B can be made from a pair of mutually separable plates, including a transmission plate connected to the primary circuit and a receiving plate connected to the secondary circuit.

In this way, the primary circuit, comprising the direct voltage source 105, the wave generator 145 and the transmission plates, can be installed in a first device, whereas the secondary circuit, comprising at least the electrical load 110, the rectifier 175 and the receiving plates, can be installed on a second device, physically separate and mobile (apart) with respect to the first device.

For example, the first device could be configured as a charging base whereas the second device could be a device to be charged or to be fed, like a smartphone, a portable computer, a television set and much more.

In this way, by suitably bringing the second device towards the first device it is possible to bring together and interface each transmission plate with a corresponding receiving plate, reconstituting the resonance capacities 230A and 230B that thus make a wireless transmission system of the electrical power in a capacitive manner.

It should be noted how, with respect to the systems insulated in an inductive manner illustrated in FIG. 18, the systems insulated with capacitive coupling illustrated in FIGS. 27 and 28 have substantial advantages in terms of reduction of bulk, increased efficiency and possibility of operating at high frequency.

The systems illustrated in FIGS. 27 and 28 are also advantageous with respect to the other capacitively insulated systems that have been illustrated with reference to FIGS. 9 and 13.

The systems of FIGS. 27 and 28 indeed provide that the resonance capacities 230A and 230B act simultaneously as resonators and as insulation capacities and barrier for the direct voltage DC.

In this way, the number of components of the circuit is advantageously reduced and the resonance capacities 230A and 230B can be much smaller with respect to the insulation capacities 250 and 255 of FIG. 9 or of FIG. 13 (for example they can be selected of the order of pF, tens of pF, hundreds of pF, nF or tens of nF).

Small-sized capacities reduce the bulk and the costs, have less losses for parasitic phenomena and particularly make it possible to make circuits devoid of problems in terms of certification in the case in which insulated converters are made.

Indeed, standards exist that limit the value of the capacities that connect the primary circuit to the secondary circuit of the insulated converters, in order not to introduce safety problems and electromagnetic emissions.

Similarly, the fact that it is possible to use small-sized capacities makes it simpler to make a transmission system of the electrical power of the wireless capacitive type between physically separate devices, since the geometries of the devices, and therefore the areas available on them, do not generally allow the installation of transmitting and/or receiving plates of large sizes, necessary for obtaining capacities of large value, whereas they are absolutely compatible with the size of transmitting and/or receiving plates that must make small capacities like those generally sufficient for the schemes of FIGS. 27 and 28.

Although the systems of FIGS. 27 and 28 provide for the presence of the rectifier 175, the latter could of course be omitted if it is wished to feed the electrical load 110 with an alternating voltage.

From the insulated schemes illustrated above it is also possible to develop conceptually analogous schemes but based on a greater number of phases, for example but not exclusively based on two phases.

Figure 29:
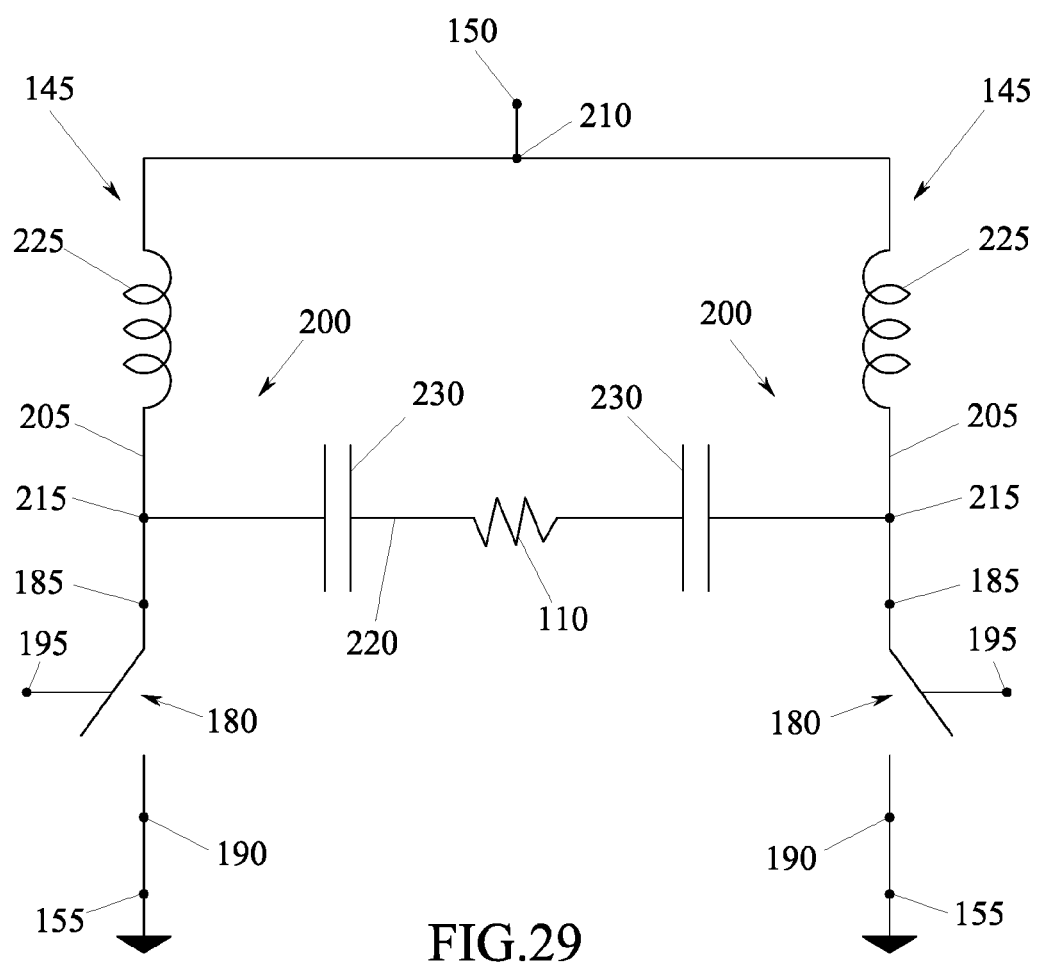

An example of this solution is illustrated in FIG. 29, in which the system 100 comprises at least two wave generators 145 substantially identical to the one illustrated in FIG. 23, with the exception of the fact that the resonance capacities 230 of these two wave generators 145 are connected to the opposite ends of the single electrical load 110.

In practice, the first terminals 210 of the resonant circuits 200 of the two wave generators 145 can be both connected with the first input terminal 150, i.e. with the direct voltage source 105, whereas the central electric nodes 215 can be connected together by a single second electrical branch 220, common to both of the wave generators 145, on which both of the resonance capacities 230 of the two wave generators 145 and, in a position arranged between said resonance capacities 230, the electrical load 110, are arranged.

In this way, the resonance capacities 230 also act as insulation capacities, galvanically insulating a primary circuit, which comprises the direct voltage source 105 and the wave generators 145, from a secondary circuit, which comprises the electrical load 110.

Also in this case, the two resonance capacities 230 can be discreet capacities or can be singularly made from a transmission plate and from a receiving plate, in a wireless transmission system of the electrical power in a capacitive manner as already described many times earlier.

The active switches 180 of the two wave generators 145 can be controlled by respective control signals, so as to turn on and off with the same frequency but not in phase with each other, i.e. so that the active switches 180 are not always turned on or off simultaneously but there is always at least a small time lapse, within every operating period, in which one active switch 180 is turned on while the other active switch 180 is turned off and vice-versa.

In this way, by suitably adjusting this time lapse, i.e. the dephasing between the control signals of the two active switches 180, it is advantageously possible to increase the power transmitted to the electrical load 110 for the same feed voltage, to reduce the voltage ripple on the electrical load 110 and/or improve the power factor of the circuit.

If the power level to the transferred to the electrical load 110 is particularly high, it is also possible to control the two active switches 180 with control signals in counterphase with one another, so that, when one active switch 180 is turned on, the other is constantly turned off and vice-versa, obtaining a Push-Pull operating mode.

It should be observed here that, although the solution of FIG. 29 does not provide for the presence of the rectifier 175, if it is necessary, the rectifier 175 could be inserted in the secondary circuit between the resonance capacities 230 and the electrical load 110.

It should be noted that, in all of the embodiments illustrated with reference to FIGS. 16 to 29, the electrical load 110 is connected to the first electrical branch 205 or to the second electrical branch 220, so that said first or second electrical branch 205 or 220 is adapted for absorbing active electrical energy by virtue of the electrical load 110 connected to it.

This characteristic, which for many aspects is advantageous, can have the side effect of reducing the reactive effect of the resonance inductance 225 or, respectively, of the resonance capacity 230.

Consequently, the tuning of the circuits described in FIGS. 16 to 29 can be more complex and more dependent on the electrical load 110 and on its possible variations, with respect to that of the circuits described in FIGS. 7 to 15.

In order to reduce the sensitivity to the electrical load 110 and to its variations, in all of the aforementioned circuits it is thus possible to introduce further reactive tuning components, i.e. further inductances and/or capacities, which can be arranged in series or in parallel with the resonance inductance 225 and/or with the resonance capacity 230.

Figure 30:
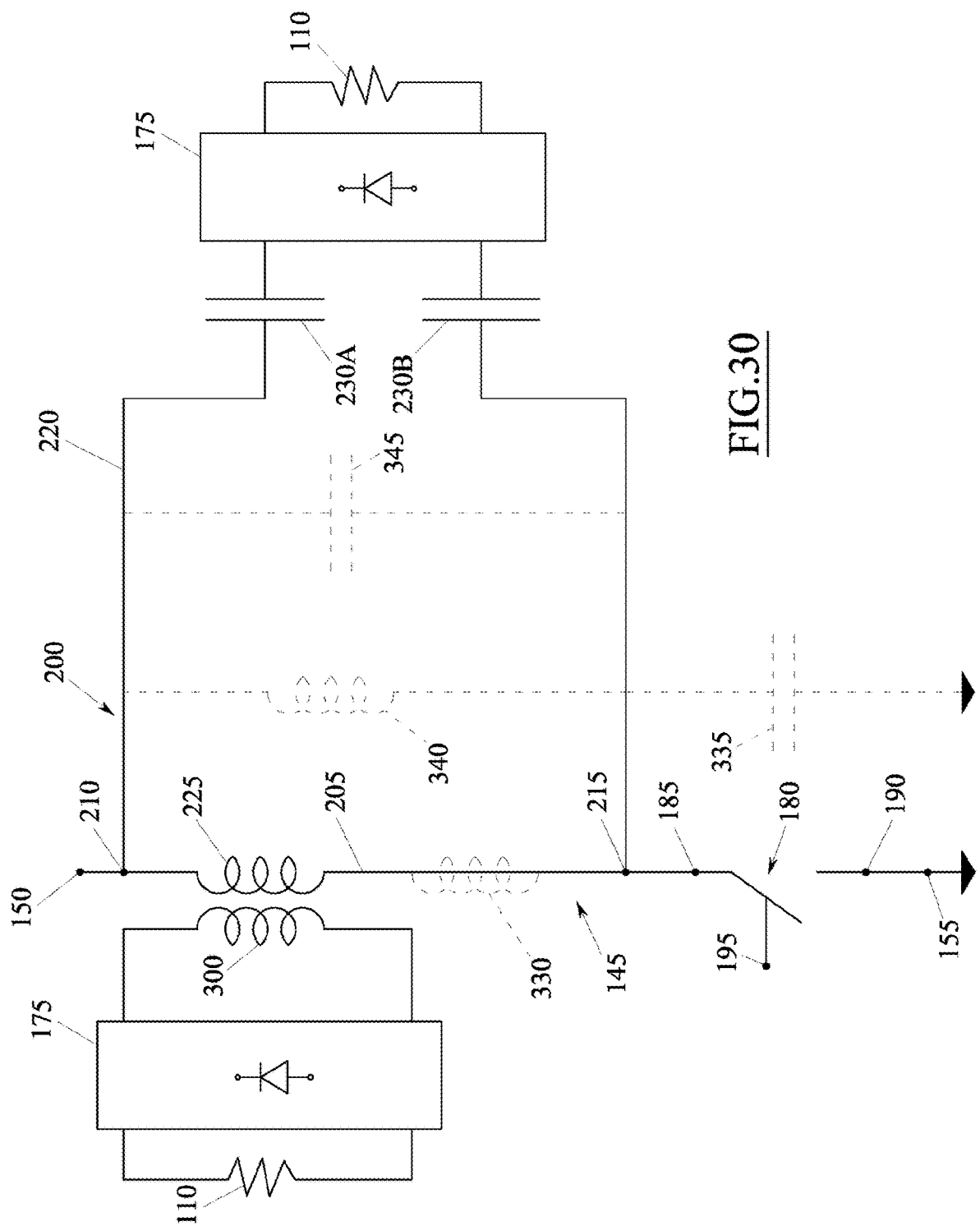
FIG. 30 is the electrical scheme of a system adapted for feeding two electrical loads simultaneously.

An example is provided by the solution illustrated in FIG. 30, in which, purely as an example, the wave generator 145 is connected simultaneously to two electric loads 110, in an inductive and capacitive manner respectively, according to the combination of the schemes already illustrated in FIGS. 18 and 27.

As can be understood from the elements with a dashed line, which are all optional, it is for example possible to add a tuning inductance 330 on the first electrical branch 205 in series with the resonance inductance 225, and/or to add a tuning capacity 335 between the central electrical node 215 and a reference voltage (i.e. in parallel with the active switch 180), and/or to add a tuning inductance 340 and/or a tuning capacity 345 in parallel with the resonance inductance 225.

Further reactive components can also be provided on the secondary circuits, since, being coupled with the primary circuit, they influence the resonance thereof as a function of the coupling parameters.

The function of the additional reactive components, which can of course be used in all of the circuits described earlier, is that of facilitating the tuning of the circuit to achieve multiple purposes, like for example: making the circuit not very sensitive to the load variations, maximising the power transferred to the load, maximising the efficiency of the circuit to ensure the switches turn on and off in zero voltage conditions (Zero Voltage Switching) and/or zero current conditions (Zero Current Switching), reducing the peak voltage on the active switch 180, reducing the average currents in the components, reducing the sensitivity of the circuit to the tolerances of the components, reducing the sensitivity of the circuit to the parasitic parameters of the components (for example, in the case in which a MOSFET is used as active switch 180, the parasitic capacity between the drain terminal and the source terminal).

Although the scheme of FIG. 30 is purely an example, it also demonstrates how all of the circuits and the solutions described earlier can be combined with each other, so as to obtain a system 100 capable of simultaneously feeding two or more distinct electric loads 110.

Figure 31:
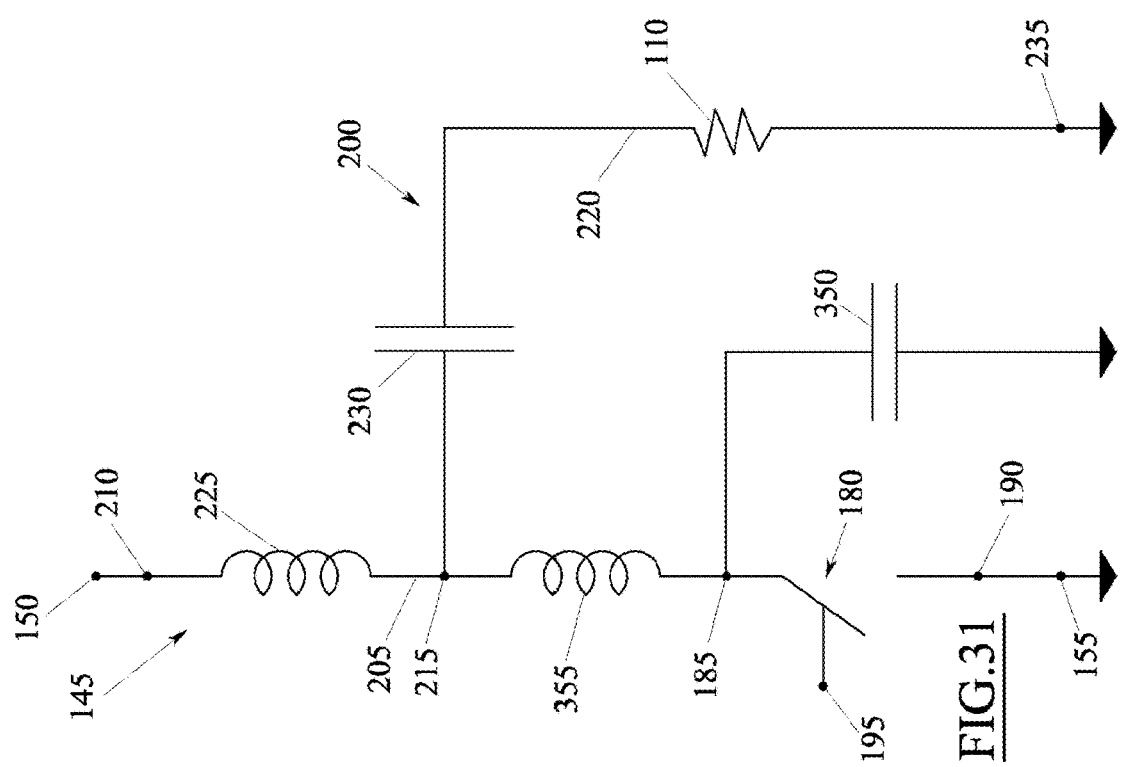
FIG. 31 is the electrical scheme of a further embodiment of the present invention.

A particularly advantageous embodiment of the wave generator 145 according to the present invention is illustrated in FIG. 31 and represents an evolution of the embodiment of FIG. 23.

Whilst ensuring the resonance useful for having ZVS and/or ZCS transitions, the wave generator 145 illustrated in FIG. 23 is characterised by very high electric currents in the resonance inductance 225 and in the active switch 180 that reach the maximum value at the moment at which the active switch 180 is turned off, i.e. during the transition between the saturation condition (turned on) and the prevention condition (turned off).

In the saturation condition (turned on), the resistance of the active switch 180 is almost zero or negligible, as a result of which the losses in this component are extremely low even for high currents.

The losses P are indeed quantified by the following equation $P = R * I^2$ where R is the resistance and I is the electrical current.

In the prevention condition (turned off), the resistance of the active switch 180 is substantially infinite but the electrical current is zero, so that also in this case the losses in the switch are substantially negligible.

In the transition between turned on and off, on the other hand, there is a variation of the resistance of the active switch 180 in a finite time.

Considering the case of fast active switches, for example MOSFET of type N, the suitably controlled switch passes from on to off in a time of ns, tens of ns or hundreds of ns.

During this finite transient time, the resistance of the active switch 180 progressively increases and, at the same time, the current decreases in proportion, causing a dissipation peak that is not mitigated by the transition condition ZVS.

In order to tackle this problem, the wave generator 145 illustrated in FIG. 31 can be used, which differs from the one described with reference to FIG. 23 in that it comprises a further tank capacity 350 having a first terminal connected with the first terminal 185 of the active switch 180 and a second terminal connected with the second terminal 190, for example connected to a same reference voltage.

This tank capacity 350, connected in parallel to the active switch 180, makes it possible to reduce the losses during the aforementioned transients, since at the moment of turning off the active switch 180 the tank capacity 350 is discharged and constitutes a low-impedance path capable of reducing the current in the active switch 180 and thus the losses.

However, the tank capacity 350 is often too small to significantly reduce the losses. Therefore, it is preferable for the resonant circuit 200 to also comprise a further inductance 355 in series with the active switch 180, which has a first terminal connected to the central node 215 and a second terminal connected to the first terminal of the active switch 180, thus being connected in series to the parallel formed by the active switch 180 and by the tank capacity 350.

In this way, the resonant circuit 200 of the wave generator 145 will substantially comprise a first resonator LC made by the resonance inductance 225 and by the resonance capacity 230 and a second resonator LC made by the inductance 355 and by the tank capacity 350.

These two resonators LC, the inductances 225 and 355 of which are both of small value, can be tuned so as to have substantially the same waveform as a ZVS circuit in turning on phase (therefore zero voltage and low losses when turning on).

At the same time, the two resonators LC can be tuned so as to be dephased from one another, to substantially reduce the current on the switch in turning off phase, so as to approach, in turning off phase, a ZCS condition that is particularly advantageous because it has low loss.

The greater number of degrees of freedom of this circuit also ensures the possibility of implementing many solutions that ensure ZVS in turning on phase of the active switch 180 and ZCS in turning off phase, or in any case reduced current with respect to the case of FIG. 23.

The possible presence of the tank capacity 350 and of the inductance 355 is not of course limited to this embodiment but could be applied to all of the circuits described in the present description.

It should be observed that in the solution of FIG. 31, the electrical load 110 is connected so as to directly receive the voltage wave generated by the wave generator 145 and thus be fed substantially in alternating voltage.

Figure 32:
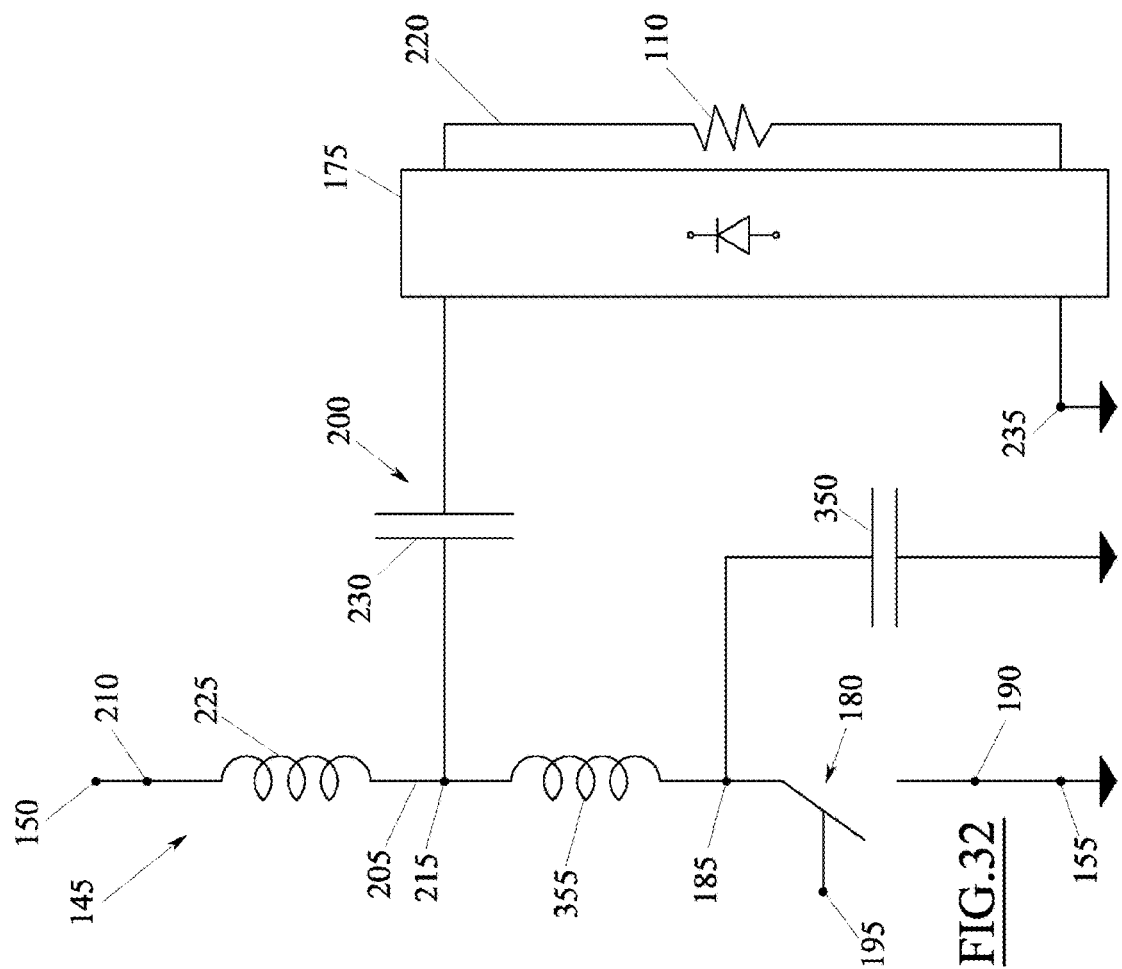

If, however, it is necessary to feed the electrical load 110 with a substantially direct voltage, it is advantageously possible to insert the rectifier 175 along the second electrical branch 220 upstream of the electrical load 110, as illustrated in the examples of FIG. 32.

Figure 33:
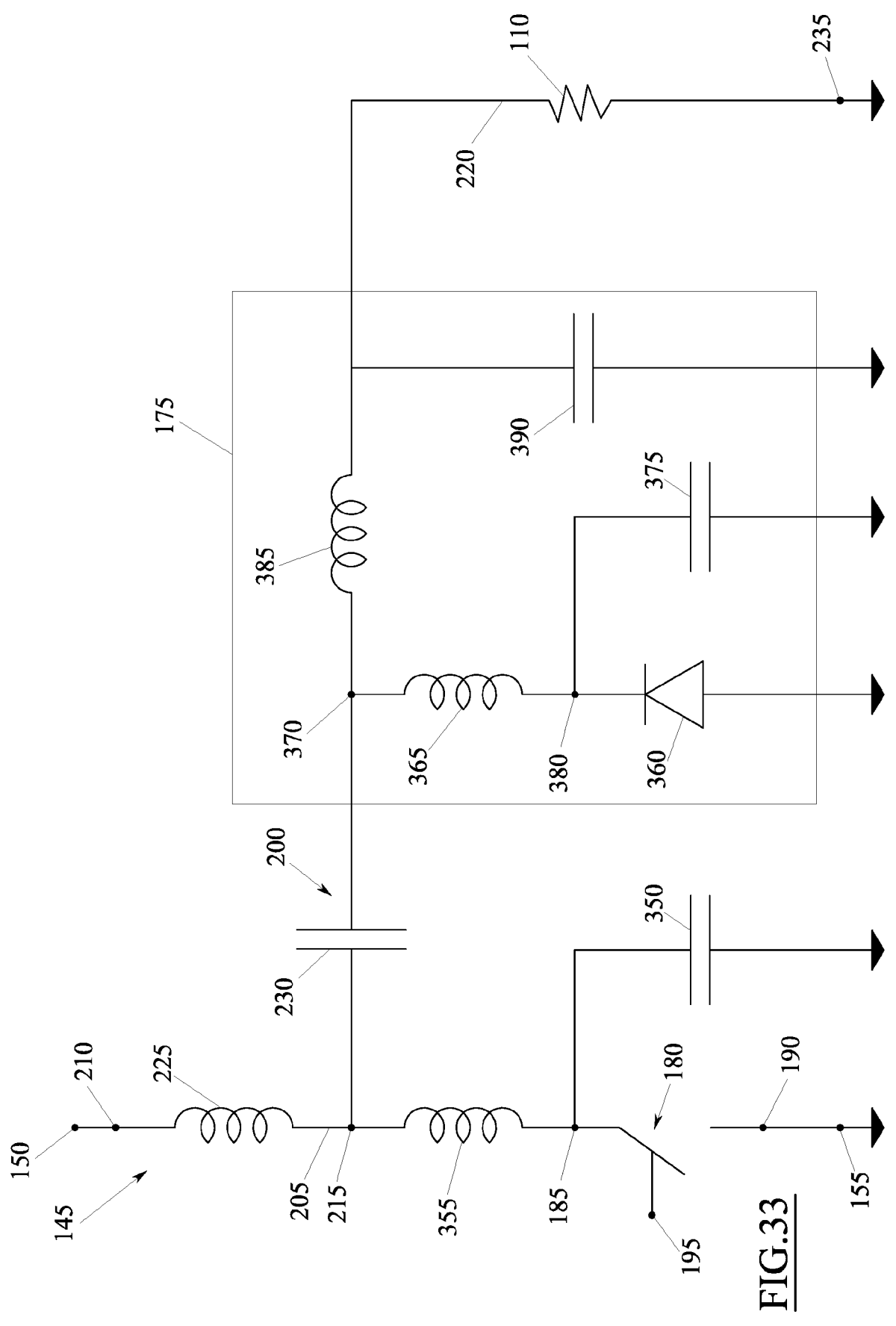

According to a particularly advantageous variant, the rectifier 175, which is represented in FIG. 32 as a generic rectification stage, can be made as illustrated in figure 33.

In practice, the rectifier 175 can comprise a diode 360 having anode connected to the reference voltage and cathode connected to a first terminal of an inductance 365, the second terminal of which is connected to an electric node 370 arranged on the second electrical branch 220 between the resonance capacity 230 and the electrical load 110.

The rectifier 175 can also comprise a capacity 375 having a first terminal connected to an electric node 380, comprised between the diode 360 and the inductance 365, and a second terminal connected with the reference voltage, so as to be in parallel with the diode 360.

The rectifier 175 can also comprise an inductance 385 arranged along the second electrical branch 220 between the electric node 370 and the electrical load 110, and possibly a capacity 390 having a first terminal referred to the reference voltage and a second terminal connected to an electric node 395 arranged between the inductance 385 and the electrical load 110.

Figure 34:
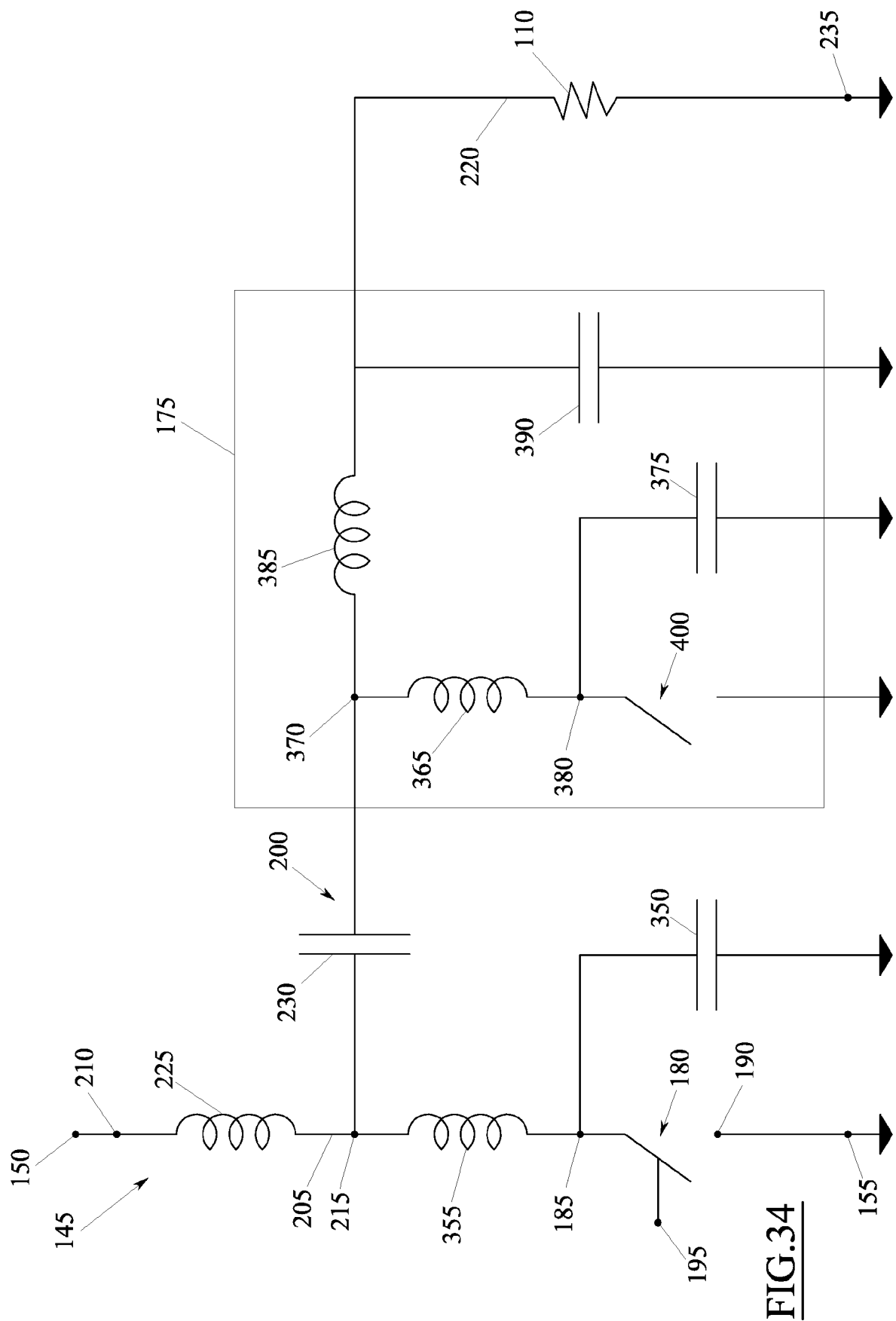

Alternatively, the diode 360 of the rectifier 175 can be replaced with an active rectification switch 400 (for example a MOSFET), as illustrated in FIG. 34.

Both of these embodiments are particularly advantageous since they make it possible to create ZVS and ZCS transitions or, in any case, transitions with low currents and low losses in the diode 360 or, respectively, in the rectification switch 395.

It should, however, be noted that the use of the rectification switch 400 instead of the diode 360 makes it possible to operate at higher frequencies, for example MHz, tens of MHz or hundreds of MHz and makes it possible, typically, to reduce the static losses.

Indeed, if we consider the example case of using a MOSFET transistor of type N or GaN as switch 400, it is possible to have a low channel resistance, which makes it possible to limit the losses with respect to the diodes.

Thanks to the presence of the rectification switch 400, the circuit of FIG. 34 also allows two different types of control.

A first control is that which provides for simulating with the rectification switch 400 an ideal diode, i.e. turning on the rectification switch 400 when the voltage on the drain drops below 0V and turning it off when the voltage rises above 0V.

A second possible control consists of referring the control signal of the rectification switch 400 with respect to the control signal of the active switch 180 of the wave generator 145, with a dephasing between these two control signals that is variable between a minimum value and a maximum value, in order to adjust the power transferred to the electrical load 110.

From the schemes illustrated in FIGS. 31 to 34 it is also possible to develop insulated solutions, in which the direct voltage source 105 is arranged in a primary circuit and in which the electrical load 110 is arranged in a secondary circuit, which is galvanically insulated with respect to the primary circuit but is electrically coupled with it through a capacitive coupling system.

Figure 35:
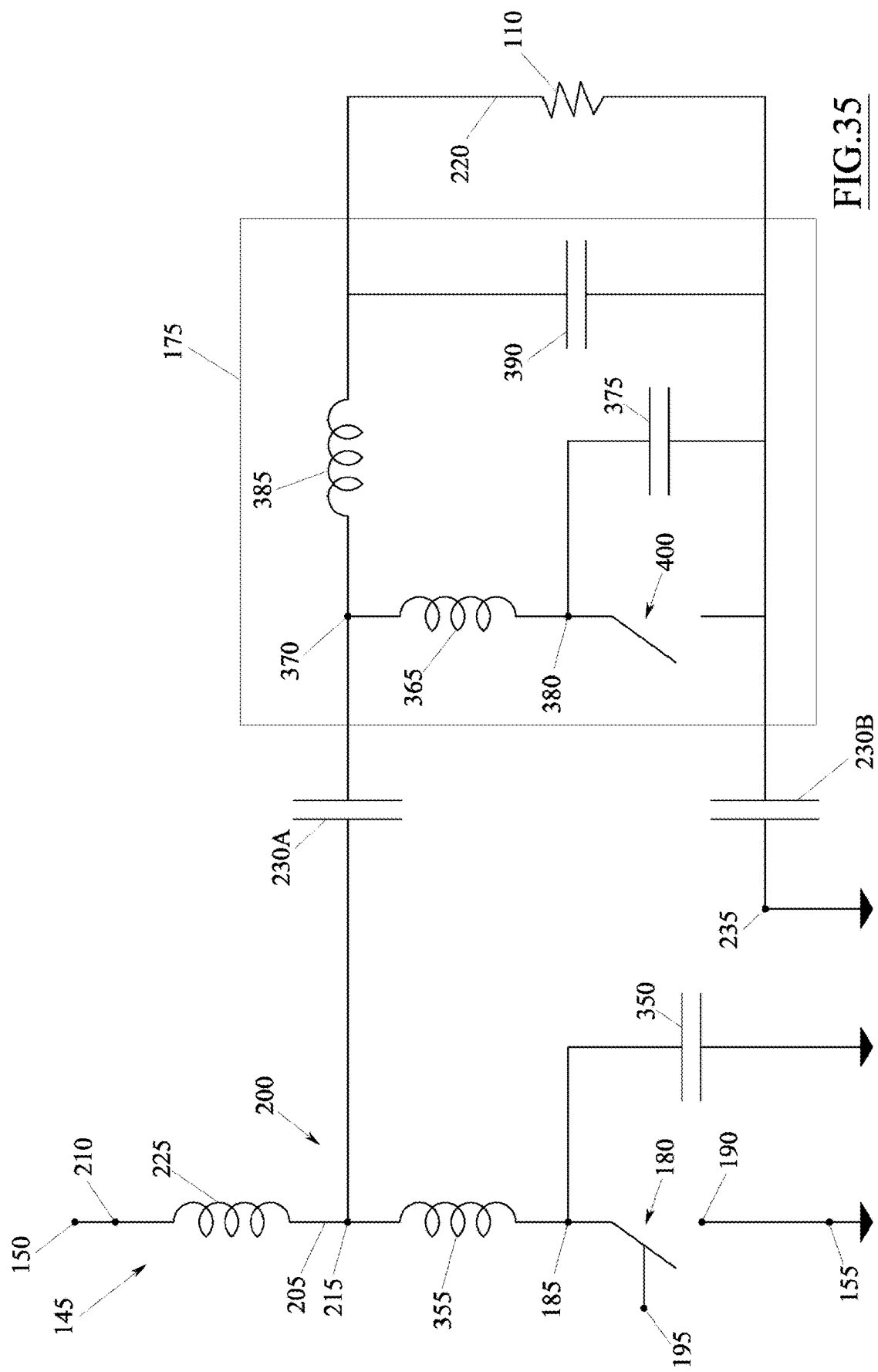

For example, FIG. 35 illustrates a circuit scheme identical to that of FIG. 32 with the exception of the fact that the resonance capacity 230 is divided into two resonance capacities 230A and 230B, which are arranged on the second electrical branch 220, respectively between the central electrical node 215 of the resonant circuit 200 and the electrical load 110, for example upstream of the rectifier 175, and between the electrical load 110 and the terminal 235 that is connected to the reference voltage, for example downstream of the rectifier 175.

Also in the insulated case, the rectifier 175 can possibly be made as described earlier for the non-insulated case, with the sole difference that, as illustrated in FIG. 35, the second terminal of the rectification switch 400, the second terminal of the capacities 375 and 390 (if present) and the second terminal of the load 110 are all referred to an electric node connected to the second resonance capacity 230B.

Of course, also in this case, the rectification switch 400 could be replaced by the diode 360, in an analogous manner to what is illustrated in FIG. 33.

From the insulated schemes illustrated above it is possible to develop conceptually analogous schemes but based on a greater number of phases, for example but not exclusively based on two phases, in order to ensure more power transmitted to the electrical load 110 for the same voltage.

Figure 36:
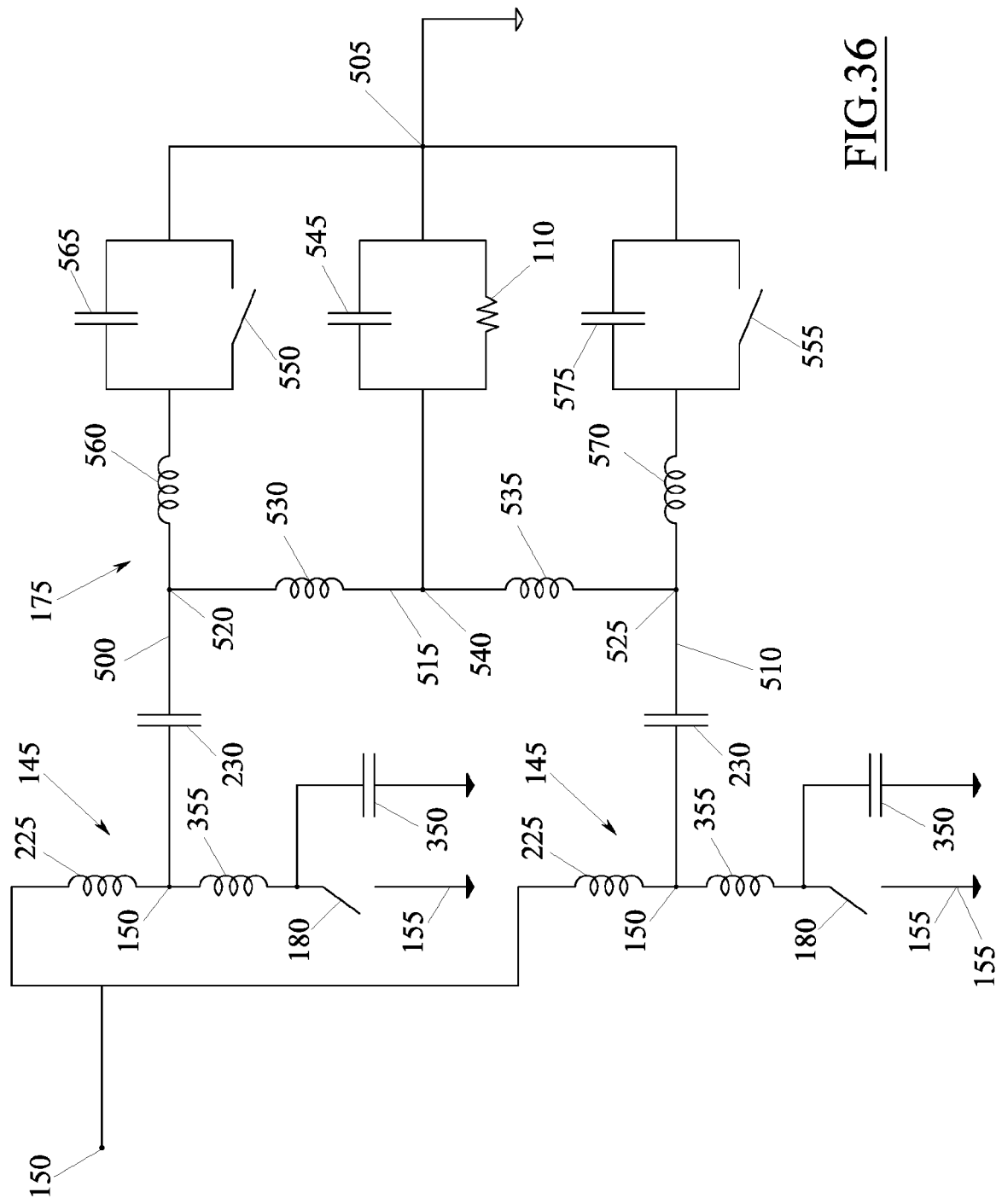

An example of this solution is illustrated in FIG. 36, in which the system 100 comprises at least two wave generators 145 substantially identical to the one illustrated in FIG. 31, with the exception of the fact that the resonance capacities 230 of these two wave generators 145 are connected to the opposite ends of the single electrical load 110, so as to also act as insulation capacities.

The active switches 180 of the two wave generators 145 can be controlled by respective control signals, so as to turn on and off with the same frequency but not in phase with each other, i.e. so that the active switches 180 are not always turned on or off simultaneously but there is always at least one small time lapse, within every operating period, in which one active switch 180 is turned on while the other active switch 180 is turned off and vice-versa.

In this way, by suitably adjusting this time lapse, i.e. the dephasing between the control signals of the two active switches 180, it is advantageously possible to increase the power transmitted to the electrical load 110 for the same feed voltage, to reduce the voltage ripple on the electrical load 110 and/or to improve the power factor of the circuit.

If the power level to be transferred to the electrical load 110 is particularly high, it is also possible to control the two active switches 180 with control signals in counterphase with one another, so that, when one active switch 180 is turned on, the other is constantly turned off and vice-versa, obtaining a Push-Pull operating mode.

Also in this case, between the resonance capacities 230 and the load 110 it is possible to arrange a rectifier 175, which can be made according to any one of the embodiments illustrated previously or in any other way.

For example, the rectifier 175 can be made according to one of the embodiments illustrated in Italian patent application No. 102017000139734 filed by the same Applicant, said patent application being considered included here for reference.

In particular, as illustrated in FIG. 36, the rectifier 175 can comprise a first electrical branch 500 adapted for connecting a resonance and insulation capacity 230 with a reference node 505, i.e. referred to a reference voltage, and a second electrical branch 510 adapted for connecting said reference node 505 with the other resonance and insulation capacity 230.

The rectifier 175 also comprises a third electrical branch 515 adapted for connecting an intermediate node 520 of the first electrical branch 500 with an intermediate node 525 of the second electrical branch 510.

On this third electrical branch 515 there are two inductances, including a first inductance 530 having a terminal connected with the intermediate node 520 and a second inductance 535 having a terminal connected with the intermediate node 252.

The opposite terminals of said two inductances 530 and 535 are connected together in a central node 540 of the third electrical branch 515.

Between the central node 540 and the reference node 505 the electrical load 110 and, possibly, a capacity 545 is connected in parallel to the electrical load 110.

The rectifier 175 also comprises two active switches, including a first active switch 550 arranged on the first electrical branch 500, connected between the intermediate node 520 and the reference node 505, and a second active switch 555 arranged on the second electrical branch 510, connected between the intermediate node 525 and the reference node.

In detail, each active switch 550 and 555 comprises a first conduction terminal connected to the reference node 505 and a second conduction terminal connected to the respective intermediate node 520 or 525.

In addition, each active switch 550 and 555 comprises a control terminal coupled with a control module (not illustrated) to receive a respective control signal.

Possibly, on the first electrical branch 500, between the intermediate node 520 and the reference node 505, there can be a further inductance 560 connected in series to the active switch 550 and/or a bridge capacity 565 connected in parallel to the active switch 550.

Similarly, on the second electrical branch 510, between the intermediate node 525 and the reference node 505, there can be a further inductance 570 connected in series to the active switch 555 and/or a bridge capacity 575 connected in parallel to the active switch 555.

In operation, the two active switches 550 and 555 can be turned on and off alternately, in order to rectify respective half-waves of the voltage wave applied between the capacities 230.

For example, each of the two active switches 550 and 555 can be controlled so as to simulate an ideal diode, i.e. turning it on when the voltage in the respective intermediate node 520 and 525 drops below 0V and turning it off when the voltage rises above 0V.

In this way, the rectifier 175 can be configured to rectify the input voltage wave with analogous modes to those of a double half-wave rectification based on centre tapped transformer, but without the need for a transformer element, with synchronous rectification capacity that is particularly efficient even at very high frequency and therefore with reduction of the bulk, of the costs and of the energy dissipation.

Of course, this type of rectifier 175 is only a non-limiting example that, moreover, is not only applicable to the system according to the scheme of FIG. 37 but it could be applied to all of the other embodiments in the present description.

Having said that, it should be observed that in the insulated embodiments illustrated in FIGS. 35 and 36, the two resonance/insulation capacities can be discreet capacities, i.e. inseparable components comprising a first terminal connected to the primary circuit and a second terminal connected to the secondary circuit, so as to make a single and inseparable device, like for example an insulated electric converter.

In other embodiments, each resonance/insulation capacity could however be made from a pair of mutually separable plates, including a transmission plate connected to the primary circuit and a receiving plate connected to the secondary circuit.

In this way, the primary circuit, comprising the direct voltage source 105, the wave generator 145 and the transmission plates, can be installed in a first device, whereas the secondary circuit, comprising at least the electrical load 110, the rectifier 175 and the receiving plates, can be installed on a second device, physically separate and mobile (apart) with respect to the first device.

For example, the first device could be configured as a charging base whereas the second device could be a device to be charged or to be fed, like a smartphone, a portable computer, a television set and much more.

In this way, by suitably bringing the second device towards the first device it is possible to bring together and interface each transmission plate with a corresponding receiving plate, reconstituting the resonance/insulation capacities that thus make a wireless transmission system of the electrical power in a capacitive manner.

In an alternative sizing of the circuits illustrated in FIGS. 31 to 36, the resonance inductances 225 and 385 have inductive values much higher than the inductances 355 and 365, so as to have all of the advantages illustrated previously and only two inductors 355 and 365 of very small size and crossed by currents characterised by large variations over time (high ratio between RMS current and average current), whereas the inductors 225 and 385 can be larger, in order to limit the average current in all of the components, behaving as current generators, and characterised by low ripple.

This type of sizing ensures, for example, the use of small inductors wound in air for the inductors 355 and 365, characterised by high oscillations of the current at high frequency, and of inductors wound on a ferromagnetic core for the inductors 225 and 385, characterised by low current ripple useful for limiting the losses in the core. Alternatively, all of the inductors can be wound in air, provided that the operating frequency is sufficiently high to allow sizings characterised by small inductance values (tens or hundreds of nH).

Of course, those skilled in the art can bring numerous modifications of a technical-application type to everything described, without for this reason departing from the scope of the invention as claimed below.

The invention claimed is:

1. A system for transferring electrical power to an electrical load, comprising:
a direct electrical voltage source, and
at least one wave generator adapted for converting the direct electric voltage into voltage waves to be transmitted to the electrical load, said wave generator comprising a first input terminal and a second input terminal, which are connected to the direct electrical voltage source so that a substantially constant voltage difference is applied between them,
wherein said wave generator comprises at least:
an active switch provided with two connection terminals and adapted for being controlled by an electric control signal between a saturation condition, in which it allows the passage of electrical current between said connection terminals, and a prevention condition, in which it prevents said passage of electrical current, and
a resonant circuit tuned to reduce the electrical power applied to said active switch in the moments in which said active switch switches from the saturation condition to the prevention condition and vice-versa,
wherein said resonant circuit comprises at least:
a central electrical node to which a first connection terminal of the active switch is connected, the second connection terminal of the active switch being connected to the second input terminal,
a first electrical branch extending between said central electrical node and the first input terminal,
a second electrical branch extending between said central electrical node and the first input terminal or between said central electrical node and a further terminal connected to a reference voltage, a resonance inductance arranged on the first electrical branch, and a resonance capacity arranged on the second electrical branch, wherein the electrical load is connected to the first electrical branch of the resonant circuit, so that said first electrical branch is adapted for absorbing active electrical energy by virtue of the electrical load connected to it, wherein the electrical load is arranged in a secondary circuit, which is galvanically insulated from the first electrical branch to which it is electrically connected through inductive coupling.

2. A system according to claim 1, wherein said inductive coupling comprises the resonance inductance and a coupling inductance arranged in the secondary circuit and adapted for inductively coupling with the resonance inductance.

3. A system according to claim 2, wherein said inductive coupling comprises a transformer provided with a magnetic core on which a primary winding is wound, which at least partially constitutes the resonance inductance, and a secondary winding, which at least partially constitutes the coupling inductance.

4. A system according to claim 2, wherein the inductive coupling comprises a wireless transmission coil, which at least partially constitutes the resonance inductance, and a wireless receiving coil, which at least partially constitutes the coupling inductance.

5. A system according to claim 1, comprising at least two of said wave generators, which are configured to transmit mutually dephased voltage waves to the electrical load.

6. A system according to claim 1, comprising a rectifier adapted for receiving the voltage wave generated by the wave generator, for converting said voltage waves into a rectified voltage and for applying said rectified voltage to the electrical load.

7. A system according to claim 1, wherein the direct voltage source comprises a rectifier adapted for receiving an alternating voltage in input and for converting said alternating voltage into direct voltage.

8. A system according to claim 1, wherein said resonant circuit comprises a tank capacity connected in parallel to the active switch.

9. A system according to claim 8, wherein the resonant circuit comprises an inductance arranged in series between the central electrical node and the active switch.

* * * * *